(12) United States Patent
Yang et al.

(10) Patent No.: US 9,780,238 B2
(45) Date of Patent: Oct. 3, 2017

(54) METAL-CHALCOGENIDE PHOTOVOLTAIC DEVICE WITH METAL-OXIDE NANOPARTICLE WINDOW LAYER

(71) Applicant: The Regents of the University of California, Oakland, CA (US)

(72) Inventors: Yang Yang, Los Angeles, CA (US); Huanping Zhou, Los Angeles, CA (US); Bao Lei, Los Angeles, CA (US); Choong-Heui Chung, Los Angeles, CA (US); Brion P. Bob, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/371,605

(22) PCT Filed: Jan. 14, 2013

(86) PCT No.: PCT/US2013/021452
§ 371 (c)(1),
(2) Date: Jul. 10, 2014

(87) PCT Pub. No.: WO2013/106836
PCT Pub. Date: Jul. 18, 2013

(65) Prior Publication Data
US 2014/0326311 A1    Nov. 6, 2014

Related U.S. Application Data

(60) Provisional application No. 61/586,377, filed on Jan. 13, 2012.

(51) Int. Cl.
*H01L 31/0224* (2006.01)
*H01L 31/0296* (2006.01)
(Continued)

(52) U.S. Cl.
CPC .. *H01L 31/022466* (2013.01); *H01L 31/0296* (2013.01); *H01L 31/0322* (2013.01);
(Continued)

(58) Field of Classification Search
CPC ......... H01L 31/022466; H01L 31/0296; H01L 31/0322; H01L 31/0323; H01L 31/0326;
(Continued)

(56) References Cited

U.S. PATENT DOCUMENTS 7,182,929 B1 * 2/2007 Singhal ................. B82Y 30/00
423/111
2002/0043279 A1 * 4/2002 Karg .................... H01L 31/0749
136/262

(Continued)

FOREIGN PATENT DOCUMENTS

JP    2009-076842    4/2009
JP    2009-528680    8/2009
(Continued)

OTHER PUBLICATIONS

Hau, et al., "Air-stable inverted flexible polymer solar cells using zinc oxide nanoparticles as an electron selective layer", Applied Physics Letters, vol. 92 (2008), 253301.*

(Continued)

*Primary Examiner* — James Lin
*Assistant Examiner* — William E McClain
(74) *Attorney, Agent, or Firm* — Venable LLP; Henry J. Daley; Laura G. Remus

(57) ABSTRACT

A metal-chalcogenide photovoltaic device includes a first electrode, a window layer spaced apart from the first electrode, and a photon-absorption layer between the first electrode and the window layer. The photon-absorption layer includes a metal-chalcogenide semiconductor. The window layer includes a layer of metal-oxide nanoparticles, and at
(Continued)

least a portion of the window layer provides a second electrode that is substantially transparent to light within a range of operating wavelengths of the metal-chalcogenide photovoltaic device. A method of producing a metal-chalcogenide photovoltaic device includes providing a photovoltaic substructure, providing a solution of metal-oxide nanoparticles, and forming a window layer on the substructure using the solution of metal-oxide nanoparticles such that the window layer includes a layer of metal-oxide nanoparticles formed by a solution process.

14 Claims, 22 Drawing Sheets

(51) Int. Cl.
H01L 31/18 (2006.01)
H01L 31/032 (2006.01)
H01L 31/0749 (2012.01)
H01L 31/0352 (2006.01)

(52) U.S. Cl.
CPC .......... *H01L 31/0749* (2013.01); *H01L 31/18* (2013.01); *H01L 31/035218* (2013.01); *Y02E 10/541* (2013.01); *Y02P 70/521* (2015.11)

(58) Field of Classification Search
CPC ........... H01L 31/0327; H01L 31/03923; H01L 31/03925; H01L 31/03928; H01L 31/0749; H01L 31/18
See application file for complete search history.

(56) References Cited

U.S. PATENT DOCUMENTS

2006/0254461 A1* 11/2006 Hong .................. B01J 31/1815
106/287.19
2008/0257201 A1* 10/2008 Harris ................. H01L 31/0322
106/1.18
2012/0115312 A1* 5/2012 Agrawal ................ B82Y 30/00
438/478
2012/0240989 A1* 9/2012 Ramanathan
et al. ................... H01L 31/0749
136/255

FOREIGN PATENT DOCUMENTS

KR 10-2009-0039302 A 4/2009
KR 10-2009-0104304 10/2009
WO WO-2004-100250 A1 11/2004
WO WO 2010138635 A2 * 12/2010 ............. B82Y 30/00

OTHER PUBLICATIONS

Beek, et al., "Hybrid Zinc Oxide Conjugated Polymer Bulk Heterojunction Solar Cells", J. Phys. Chem. B., vol. 109 (2005), pp. 9505-9516.*

Liu, et al. "Niobium-doped titania nanoparticles: synthesis and assembly into mesoporous films and electrical conductivity." ACS nano 4.9 (2010): 5373-5381.*

International Search Report and Written Opinion of PCT/US2013/021452 dated Apr. 29, 2013.

* cited by examiner

METAL-CHALCOGENIDE PHOTOVOLTAIC DEVICE WITH METAL-OXIDE NANOPARTICLE WINDOW LAYER

CROSS-REFERENCE OF RELATED APPLICATION

This is a national stage application under 35 U.S.C. §371 of PCT/US2013/021452 filed Jan. 14, 2013, the entire contents of which are incorporated herein by reference and this application claims priority to U.S. Provisional Application No. 61/586,377 filed Jan. 13, 2012, the entire contents of which are hereby incorporated by reference.

BACKGROUND

1. Field of Invention

The field of the currently claimed embodiments of this invention relates to photovoltaic devices, and more particularly to metal-chalcogenide photovoltaic devices that have a metal-oxide nanoparticle window.

2. Discussion of Related Art

Many metal-chalcogenide semiconductors are being used for thin film photovoltaic devices due to high photon absorption and high efficiency relative to other thin film photovoltaic materials, such as amorphous silicon. In one configuration, soda lime glass is used as a substrate with a layer of molybdenum deposited on it. A metal-chalcogenide semiconductor, such as CIGS for example, is then formed on the molybdenum layer. This provides a p-type semiconductor layer upon which a second metal-chalcogenide layer of an n-type material is formed. It is believed that sodium in the soda lime glass provides beneficial properties. In other cases, other materials are used for the substrate, such as flexible materials, and sodium can be included by other means.

The molybdenum layer serves as an electrode as well as reflecting light back into the photon absorption layer of the metal-chalcogenide. A window layer is formed on the metal-chalcogenide absorption layer. The window layer can be consider to serve as, or to include a transparent electrode. Alternatively, one can consider that there is a transparent electrode formed on the window layer. The metal-chalcogenide photon-absorption layer is generally a p-type semiconductor. An n-type semiconductor buffer layer is formed on the p-type layer. Conventional devices use a buffer layer of CdS on the metal-chalcogenide photon-absorption layer. It is desirable for the window layer to be transparent to light within the region of the electromagnetic spectrum that is strongly absorbed by the metal-chalcogenide semiconductor layer. A layer of intrinsic ZnO (i-ZnO) is provided to protect the device during further processing, and then a layer of Al doped ZnO (ZnO:Al) is sputtered onto the device for the window layer. Further layers are often added, including transparent electrodes.

This process of including many layers as well as sputtering is a complex and expensive manufacturing process and the sputtering can damage the underlying structure. Furthermore, conventional devices also use a significant amount of cadmium, which is toxic. Therefore, there remains a need for improved metal-chalcogenide photovoltaic devices and methods of manufacture.

SUMMARY

A metal-chalcogenide photovoltaic device according to an embodiment of the current invention includes a first electrode, a window layer spaced apart from the first electrode, and a photon-absorption layer between the first electrode and the window layer. The photon-absorption layer includes a metal-chalcogenide semiconductor. The window layer includes a layer of metal-oxide nanoparticles, and at least a portion of the window layer provides a second electrode that is substantially transparent to light within a range of operating wavelengths of the metal-chalcogenide photovoltaic device.

A method of producing a metal-chalcogenide photovoltaic device according to an embodiment of the current invention includes providing a photovoltaic substructure, providing a solution of metal-oxide nanoparticles, and forming a window layer on the substructure using the solution of metal-oxide nanoparticles such that the window layer includes a layer of metal-oxide nanoparticles formed by a solution process. The photovoltaic substructure includes a metal-chalcogenide semiconductor photon absorption layer.

BRIEF DESCRIPTION OF THE DRAWINGS

Further objectives and advantages will become apparent from a consideration of the description, drawings, and examples.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

Figure 1:
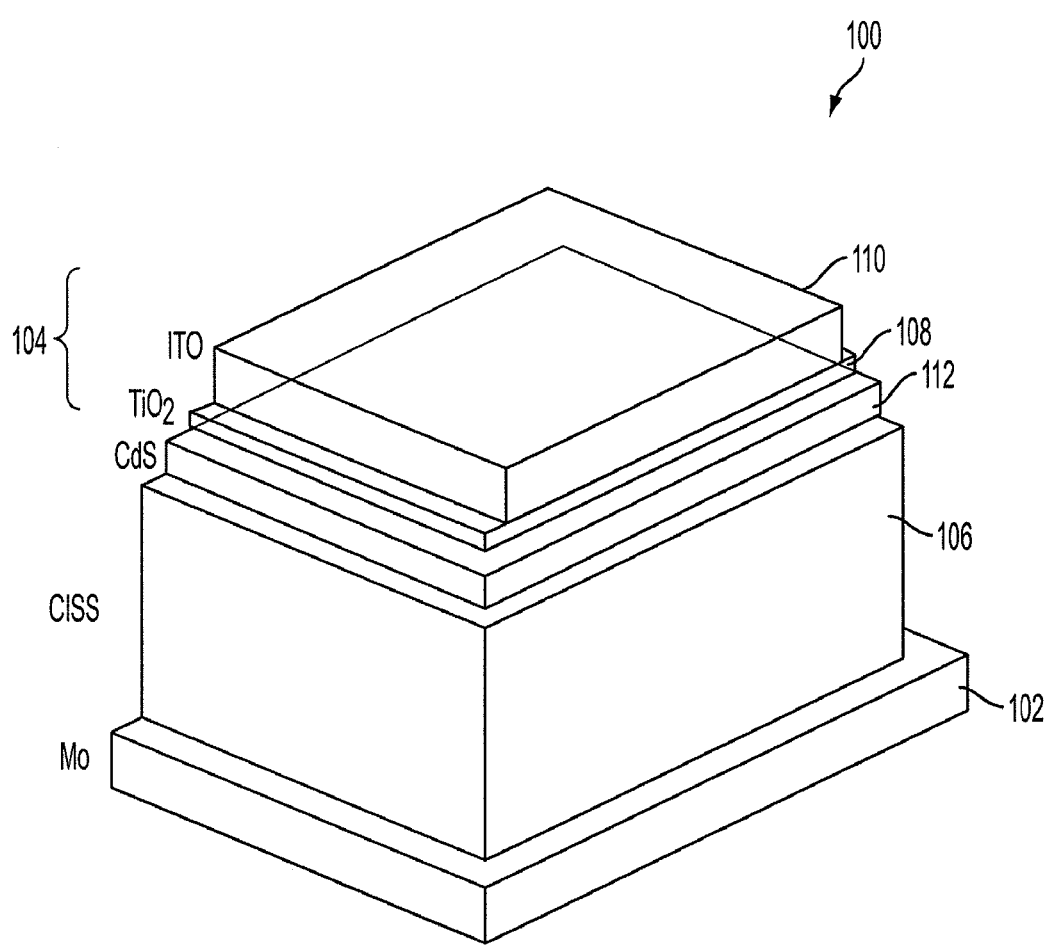
FIG. 1 is a schematic illustration of a metal-chalcogenide photovoltaic device according to an embodiment of the current invention.

FIG. 1 is a schematic illustration of a metal-chalcogenide photovoltaic device 100 according to an embodiment of the current invention. The metal-chalcogenide photovoltaic device 100 includes a first electrode 102, a window layer 104 spaced apart from the first electrode 102, and a photon-absorption layer 106 between the first electrode 102 and the window layer 104. The photon-absorption layer 106 includes a metal-chalcogenide semiconductor. The window layer 104 includes a layer of metal-oxide nanoparticles 108. At least a portion of the window layer 104 provides a second electrode 110 that is substantially transparent to light within a range of operating wavelengths of the metal-chalcogenide photovoltaic device 100.

The term "window", or "window layer" refers to a layer of the photovoltaic device that is sufficiently transparent to light that can be absorbed by the absorption layer to be useful for the particular application. The term "transparent" does not require 100% transparency in the operating band. In some cases 95% transparency, or higher may be desirable. In other cases, lower transparency may be suitable. It can be, or can include, a transparent electrode. It can be a single layer, or a multilayer structure. In the example of FIG. 1, the window layer 104 includes a layer of metal-oxide nanoparticles 108, and a transparent electrode 110. However, the concepts of the current invention are not limited to this example of two structural layers. One, two, three or more than three layers can be included. For example, other embodiments can include additional layers, such as, but not limited to, an antireflection layer.

In some embodiments, a buffer layer 112 can be included. For example, the buffer layer 112 can be an n-type metal-chalcogenide and the photon-absorption layer 106 can be a p-type metal chalcogenide. For example, the buffer layer 112 can be, but is not limited to CdS and/or ZnS.

In addition, the general concepts of the current invention are not limited to only the materials shown in the example of FIG. 1. Although ITO can be used for the transparent electrode 110 in some embodiments, other materials and structures can be used in other embodiments. For example, other embodiments may use nanowire networks and/or other nanostructured transparent electrodes in place of ITO, particularly since indium is becoming more difficult to obtain, and thus more expensive.

Although not shown in FIG. 1, the first electrode 102 can be formed on a substrate. The substrate can be, but is not limited to, soda lime glass. In other embodiments, the substrate can be other types of glass, a plastic and/or a metal, for example. In some embodiments, the substrate can be, but is not limited to, a flexible substrate, as can be the entire metal-chalcogenide photovoltaic device 100.

The term "light" is intended to have a broad meaning to include visible as well as non-visible regions of the electromagnetic spectrum. For example, infrared, near infrared and ultraviolet light are intended to be included within the definition of the term "light".

The term "nanoparticle" is intended to include any structure in which all of the outer dimensions are less than about 100 nm.

In some embodiments, the layer of metal-oxide nanoparticles 108 consists essentially of metal-oxide nanoparticles that are smaller than 50 nanometers. In further embodiments, the layer of metal-oxide nanoparticles 108 consists essentially of metal-oxide nanoparticles that are smaller than about 6.5 nanometers and larger than about 5.0 nanometers. In still further embodiments, the layer of metal-oxide nanoparticles 108 consists essentially of metal-oxide nanoparticles that are about 6.3 nanometers.

In some embodiments, the layer of metal-oxide nanoparticles 108 is less than 1000 nanometers thick. In further embodiments, the layer of metal-oxide nanoparticles 108 is less than 85 nanometers thick and greater than 15 nanometers thick. In still further embodiments, the layer of metal-oxide nanoparticles 108 is about 40 nanometers thick.

In some embodiments, the window layer 104 is in direct contact with the photon-absorption layer 106. For example, some embodiments can eliminate the buffer layer 112. Since CdS is often used for a buffer layer, which includes the use of the toxic material cadmium, some embodiments of the current invention can reduce and/or eliminate the use of cadmium in the metal-chalcogenide photovoltaic device 100. Other embodiments can use other materials, such as, but not limited to ZnS as the buffer layer. However, the broad concepts of the current invention are not limited to only devices that reduce and/or eliminate the use of cadmium.

In some embodiments, at least some of the metal-oxide nanoparticles can be doped metal-oxide nanoparticles. For example, at least some of the metal-oxide nanoparticles can be doped with a material that includes at least one of the atomic elements Cs, Cu, Co, Ni, Cr, Mn, Mo, Nb, V, Fe, Ru, Au, Ag, Pt, C, N, B, S, I, F, P, Al, Ga, In, Sn, Sb, and Cl.

In some embodiments, the metal-oxide nanoparticles can be at least one of titanium oxide nanoparticles, zinc oxide nanoparticles, nickel oxide nanoparticles, tin oxide nanoparticles, indium oxide nanoparticles, doped titanium oxide nanoparticles, doped zinc oxide nanoparticles, doped nickel oxide nanoparticles, doped tin oxide nanoparticles, doped indium oxide nanoparticles, or any mixture or compound thereof. In some embodiments, the doped titanium oxide nanoparticles, doped zinc oxide nanoparticles, doped nickel oxide nanoparticles, doped tin oxide nanoparticles, and doped indium oxide nanoparticles can be doped with a material comprising at least one of the atomic elements Cs, Cu, Co, Ni, Cr, Mn, Mo, Nb, V, Fe, Ru, Au, Ag, Pt, C, N, B, S, I, F, P, Al, Ga, In, Sn, Sb, and Cl.

In some embodiments, the metal-chalcogenide semiconductor can include at least one of $Cu(In,Ga)(Se,S)_2$, $Cu_2ZnSn(S,Se)_4$ or CdTe metal-chalcogenide semiconductors. $Cu(In,Ga)(Se,S)_2$ means any of the metal-chalcogenide semiconductors that include at least one of $CuInSe_2$, $CuInS_2$, $CuGaSe_2$, $CuGaS_2$ and/or any of the associated alloys. $Cu_2ZnSn(S,Se)_4$ means any of the metal-chalcogenide semiconductors that include at least one of $Cu_2ZnSnS_4$, $Cu_2ZnSnSe_4$ and/or any of the associated alloys.

A method of producing a metal-chalcogenide photovoltaic device according to an embodiment of the current invention includes providing a photovoltaic substructure, providing a solution of metal-oxide nanoparticles, and forming a window layer on the substructure using the solution of metal-oxide nanoparticles such that the window layer includes a layer of metal-oxide nanoparticles formed by a solution process. The photovoltaic substructure includes a metal-chalcogenide semiconductor photon absorption layer. This can provide solution processing of at least a portion of the window layer, thus eliminating the need for sputtering to produce the window layer according to some embodiments of the current invention. This can be used in combination with solution processing of some, or all, other portions of the metal-chalcogenide photovoltaic device according to some embodiments of the current invention.

In some embodiments, the solution process used to form the layer of metal-oxide nanoparticles can be at least one of a spin coating, slit coating, spray coating, dip coating, doctor blading, or printing process, for example. In some embodiments, the solution process used to form the layer of metal-oxide nanoparticles can further include a temperature annealing process in which heat is applied at a temperature less than about 400° C.

In some embodiments, the providing the solution of metal-oxide nanoparticles can further include producing metal-oxide nanoparticles by at least one of a sol-gel, hydrothermal, solvothermal, thermolysis, or micro-emulsion process, for example. In some embodiments, the above-noted materials and combinations can be used.

Examples

The following examples help explain some concepts of the current invention. However, the general concepts of the current invention are not limited to the particular examples.

Titanium dioxide ($TiO_2$) is a wide bandgap semiconductor that has proven useful in a number of optoelectronic applications, including light-emitting diodes,[1] solar cells,[2,3] and numerous photocatalytic systems.[4,5] In its applications to photovoltaic devices, this material is typically employed as a porous matrix that serves as an electrically active and mechanical support for an adsorbed dye or other absorber material.[6] The large surface area of nanoporous $TiO_2$ allows for extremely intimate contact between the absorber material and the supporting matrix, which facilitates efficient charge transfer and current generation within the device. For nearly two decades, titanium dioxide has stood as the highest performing matrix material in the production of dye sensitized solar cells (DSSC).[7] However, there is no report demonstrating solution process $TiO_2$ as a charge collection system in the efficient inorganic photovoltaic devices, such as $CuInSe_2$ (CIS), $Cu(InGa)Se_2$ (CIGS), $Cu_2ZnSnS_4$, etc.

Partially due to the large absorption coefficient, on the order of $10^5$ $cm^{-1}$, $CuInSe_2$, $CuIn(S,Se)_2$ and $Cu(In,Ga)Se_2$ have proven to be some of the most attractive photovoltaic absorber materials for thin film solar cells.[8] In order to achieve low-cost solar cells while retaining high conversion efficiency, the solution processing $CuIn(S,Se)_2$ or $Cu(In,Ga)Se_2$ has been successfully demonstrated by using hydrazine as a solvent, with up to 15% power conversion efficiency.[9] Although this method renders all the absorber components that can be processed via conventional solution-based methods, the fabrication of the window layer still suffers from energy intensive sputtering deposition. Intrinsic ZnO (i-ZnO) layer, which is deposited between the CdS buffer layer and the conductive ITO layer in CISS based devices, assists the formation of the ITO/CdS/CISS heterojunction, and controls of defect distribution at CISS surface by hindering the Fermi level to the conduction band.[10] Thus, finding a solution processed window layer material to replace the sputtered i-ZnO is of great interest from both scientific and commercial (cost-reduction) points of view.

Based on a consideration of the similarity of electronic properties of i-ZnO compared to $TiO_2$, and solution processing capability of $TiO_2$, some embodiments of the current invention use $TiO_2$ as an alternative material for sputtered ZnO in the window layer.[11] However, to be compatible with solid state inorganic photon absorbers, such as $CuIn(S,Se)_2$ and $Cu(In,Ga)Se_2$, synthetic methods for $TiO_2$ film have been explored according to some embodiments of the current invention to provide a compact and dense film with well-defined space charge region rather than a porous matrix of interfacial junctions, such as is found in the DSSC system. Hence, a dense $TiO_2$ layer can be effective to lower the interface resistance and preserve the nature of CISS/CdS heterojunctions according to an embodiment of the current invention.

Figure 2:
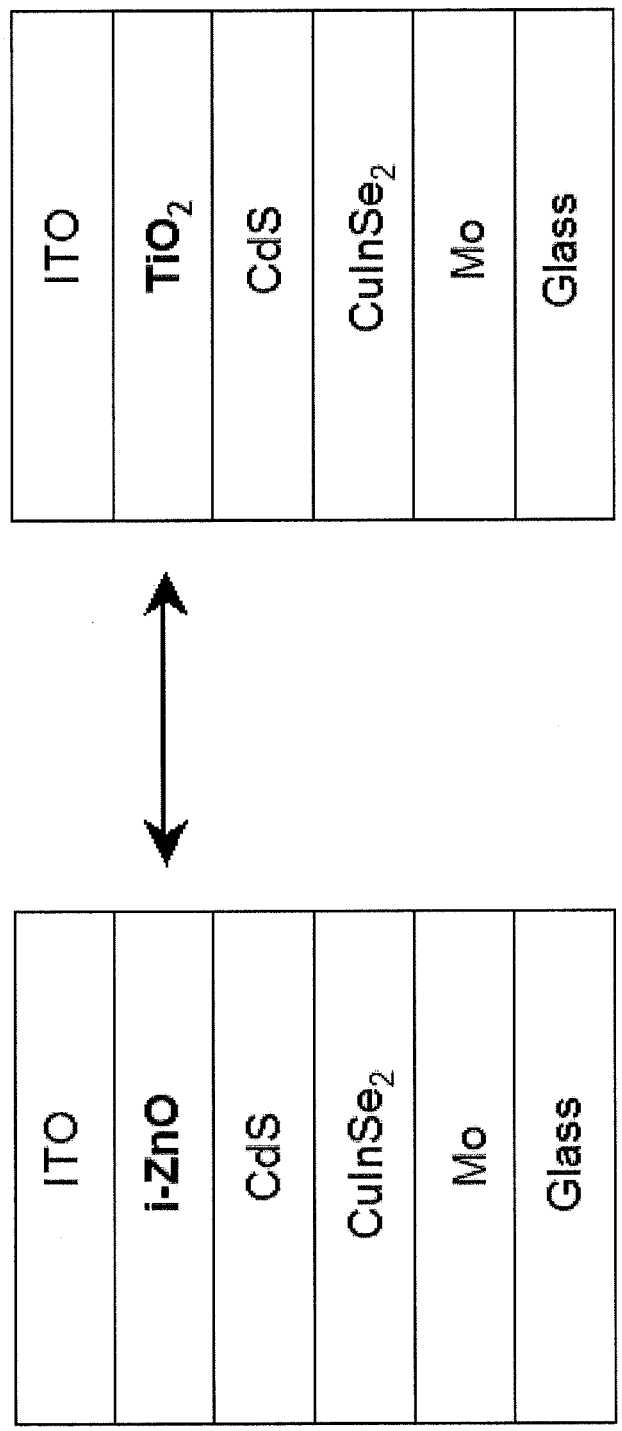
FIG. 2 compares the device of FIG. 1 to a conventional device.

In the following examples, a nano-crystal (NC) thin film made from solution-processed titanium dioxide nanoparticles has been utilized in the window layer of a CISS solar cell (FIGS. 1 and 2). Pre-synthesized 6-nm $TiO_2$ nanocrystals are assembled into this NC film with controllable thickness of 40, 80, 160 nm thickness via a spin coating process. Performance characterization of the device before rapid thermal annealing, indicates 40 and 80 nm-thick $TiO_2$ films exhibit comparable power conversion efficiency (PCE~6.2% and 6.33%) to the standard baseline device based on a sputtered intrinsic zinc oxide (ZnO) window layer (PCE~6.42%). On the other hand, the 160 nm-thick $TiO_2$ NC film dramatically decreased the PCE to ~2.2%, owing to the large series resistance. Different $TiO_2$ morphology also affects PV cell performance. Short-time reaction[12] leads to the aggregated nanoparticles with much lower efficiency (around 2%) than that composed from well-dispersed $TiO_2$ nanoparticles. This is probably due to a dense $TiO_2$ film, which assists the charge transport property. Under the optimized condition, the champion $TiO_2$ nanocrystals film-based device have shown even higher efficiency (PCE~9.2%) than the typical i-ZnO film-based device (8.6%). To our knowledge, this is the first demonstrated use of (solution processed) $TiO_2$ as a window layer material in the fabrication of efficient $CuInSe_2$ photovoltaic devices.

Figure 3A:
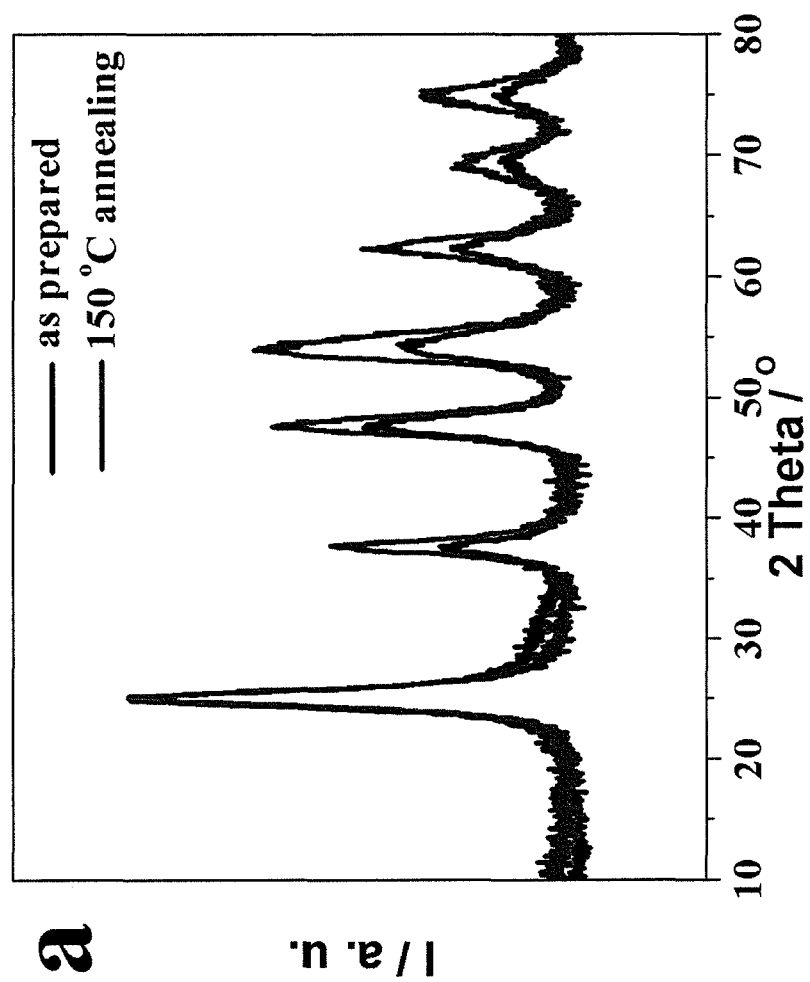
FIG. 3A shows XRD pattern data of as-prepared and annealed $TiO_2$ nanocrystals according to an embodiment of the current invention.

Results and Discussion $TiO_2$ Nanocrystals $TiO_2$ nanocrystals were synthesized following a published sol-gel method[12] with modified reaction time of from 9 h to 15 h, and characterized by X-ray diffraction (XRD) and transmission electron microscopy (TEM). The as-prepared $TiO_2$ is annealed at 150° C., which ensures complete removal of the absorbing organic molecules, such as ethanol, benzyl alcohol on $TiO_2$ surface. FIG. 3A shows the powder XRD pattern for both the as-prepared and annealed $TiO_2$ nanocrystals. Both samples exhibit similar peaks, that can be assigned to the anatase phase of $TiO_2$ (JPCD:71-1168) (FIG. 3A). Compared with the as-prepared $TiO_2$ nanocrystals, the annealed nanocrystals show sharper diffraction peaks indicative the increased crystallinity of the nanocrystals. The particle size of the as-prepared and annealed $TiO_2$ nanoparticles were analyzed from the diffraction pattern by using Scherrer formula, and the calculated particle size is 5.7 nm and 6.3 nm, respectively, suggesting thermal annealing slightly change the particle size.

Figure 3B:
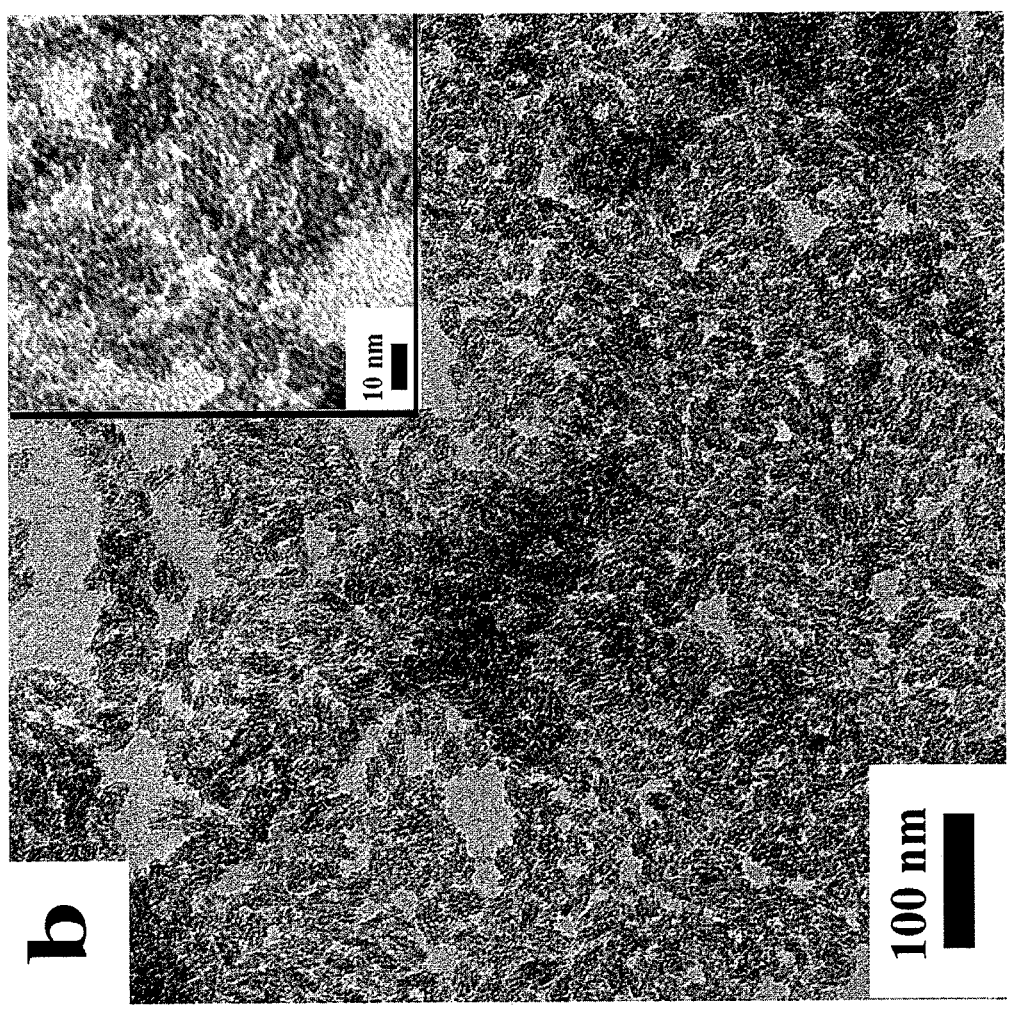
FIGS. 3B and 3C show TEM images of the as-prepared and annealed $TiO_2$ nanocrystals, respectively.
Figure 3C:
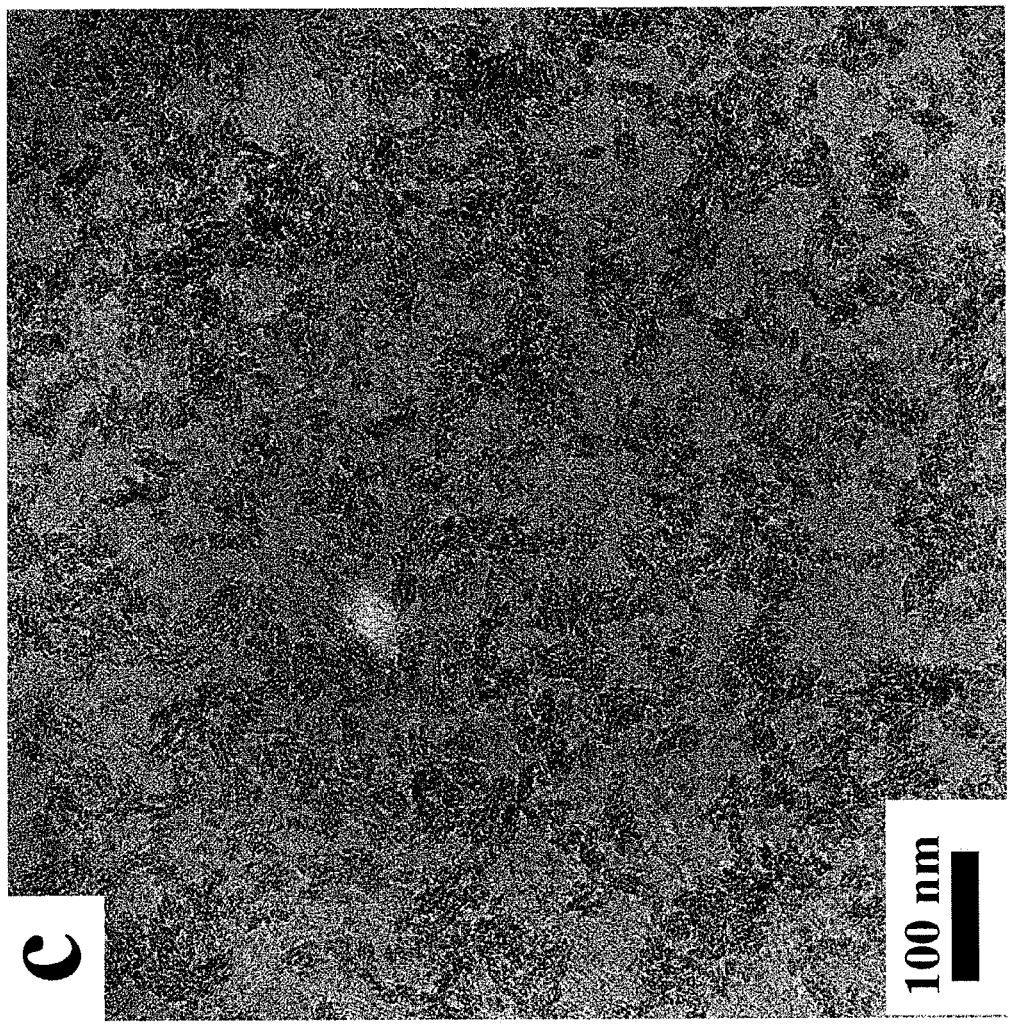

$TiO_2$ nanoparticles were further characterized by TEM. TEM images of the as-prepared and annealed $TiO_2$ nanocrystals were shown in FIGS. 3B and 3C. According to these images, $TiO_2$ nanoparticles were uniformly distributed on the grid. The particle size of $TiO_2$ nanoparticles is around 6 nm, which is consistent with the value determined from XRD. The comparison between FIGS. 3B and 3C indicates that the annealing treatment does not change the morphology and dispersion of the as-prepared $TiO_2$ nanocrystals. The well-dispersed $TiO_2$ nanocrystals in the present work is different from the reported results,[12] where the attachment of the $TiO_2$ nanocrystals form a porous mesoscopic network, after annealing or doped with other elements. This difference suggests that increased reaction time from 9 h to 15 h probably improves the crystallinity and dispersion of the $TiO_2$ nanocrystals, and prevents inter-particle attachments. It is likely the dense film assists better charge transport.

$TiO_2$ Nanocrystals Film

As-prepared $TiO_2$ nanocrystals assemble into a continuous film through depositing the $TiO_2$ nanoparticles on the n-CdS or glass substrate, followed by annealing at 150° C. for 10 min. Deposition/annealing cycles were executed for 1, 2 or 4 times, to produce the $TiO_2$ films with different thicknesses. Surface morphology and cross section scanning electron microscopy were used to characterize the morphology and thickness of the as-formed $TiO_2$ films. For the SEM images in FIG. 4, different thickness-$TiO_2$ were deposited on the top of n-type CdS layer because not only the morphology and thickness of $TiO_2$ film, but also adhesion between buffer layer and window layer, can be unveiled from SEM characterization. Deposition of $TiO_2$ for 1, 2, or 4 times produces film thickness of 40, 80, and 160 nm, respectively. Notably, the continuous $TiO_2$ film composed of small nanoparticles, which is in agreement with the particle stability evidence from TEM images shown in FIGS. 3B and 3C. The uniform particle size and low aggregation of the nanocrystals may contribute to the continuous film without obvious (or visible) defects such as pits or voids in FIG. 4.

Figure 4A:
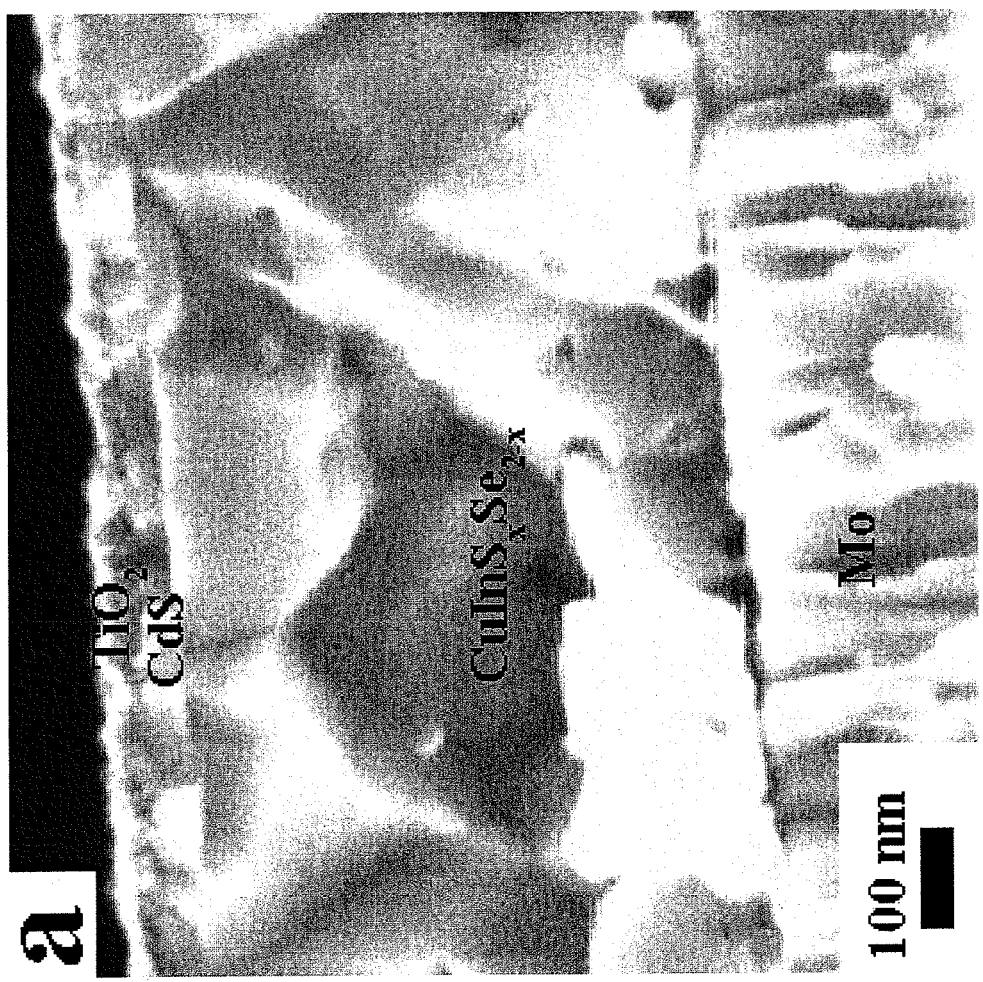
FIGS. 4A-4C show SEM images of the $TiO_2$ film with different thickness on the top of CdS layer (a) 40 nm; b) 80 nm; c) 160 nm).
Figure 4B:
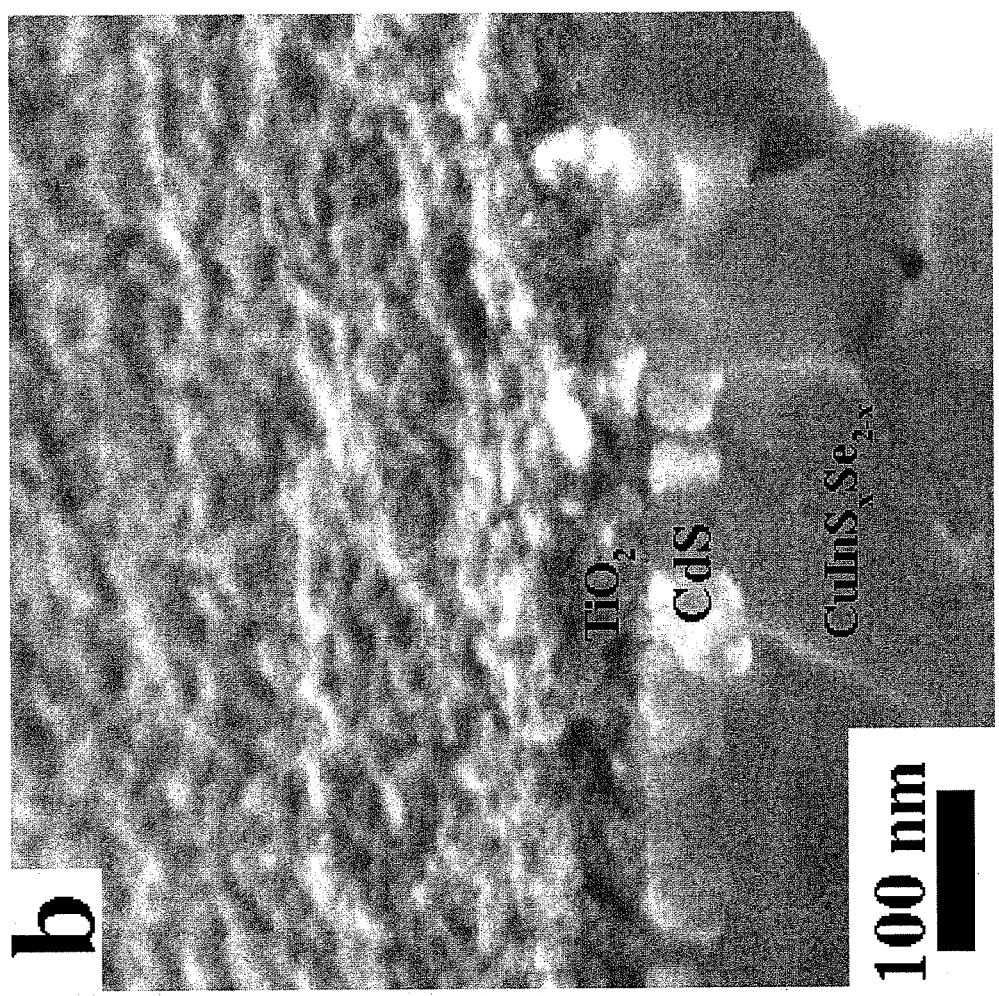
Figure 4C:
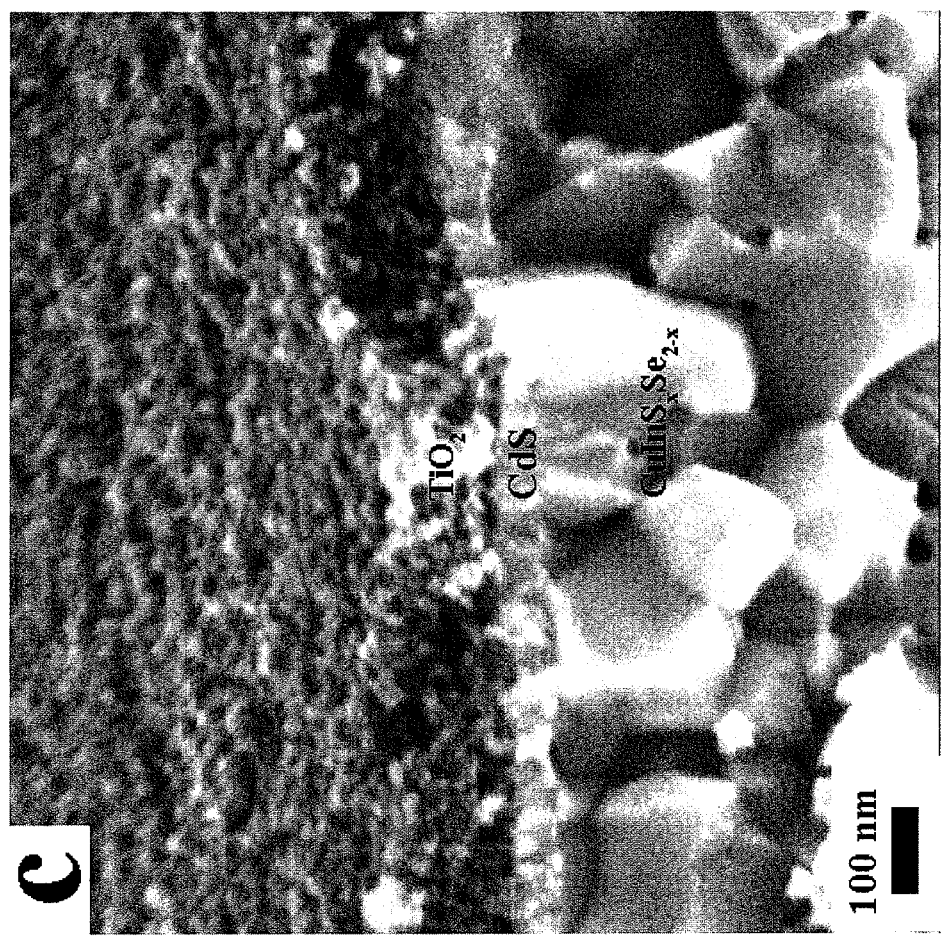
Figure 5A:
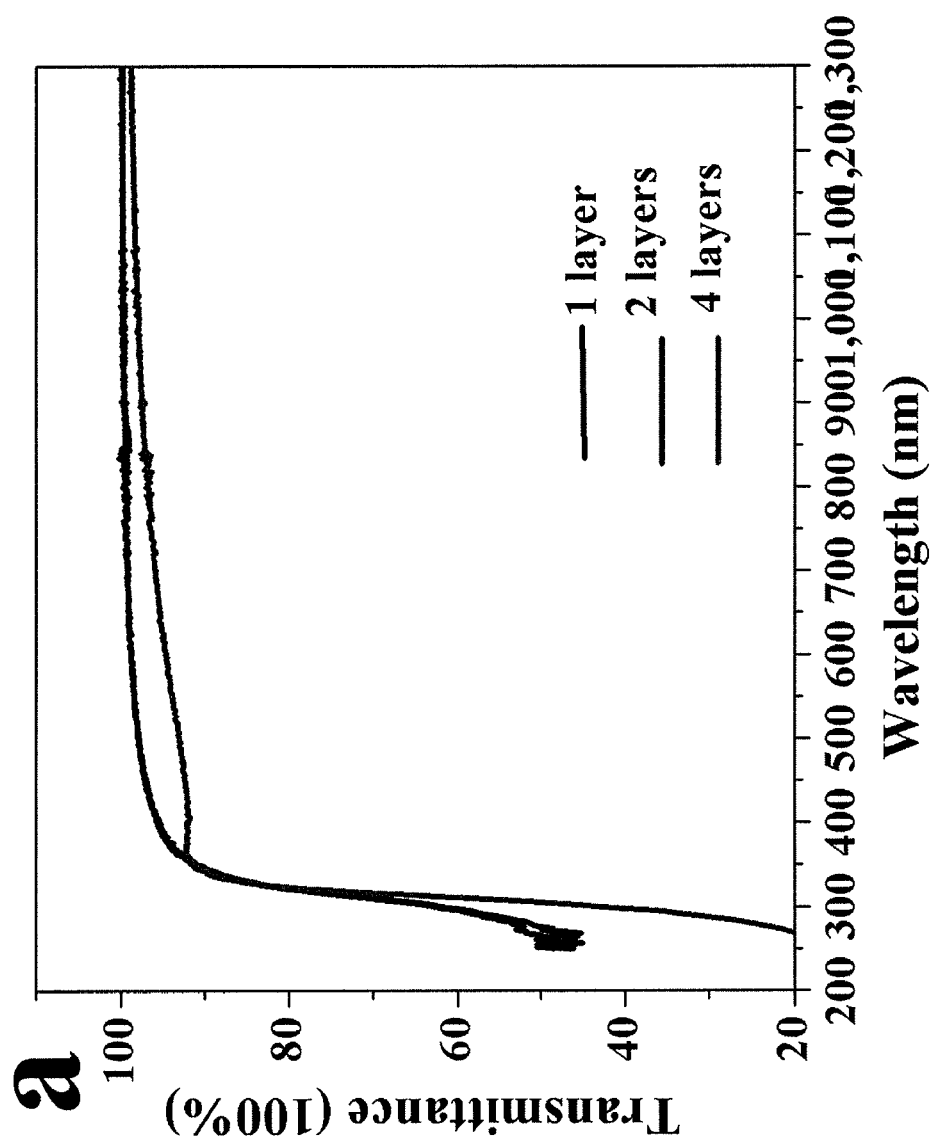
FIG. 5A shows transmittance of $TiO_2$ films with thickness of 40 nm, 80 nm and 160 nm.
Figure 5B:
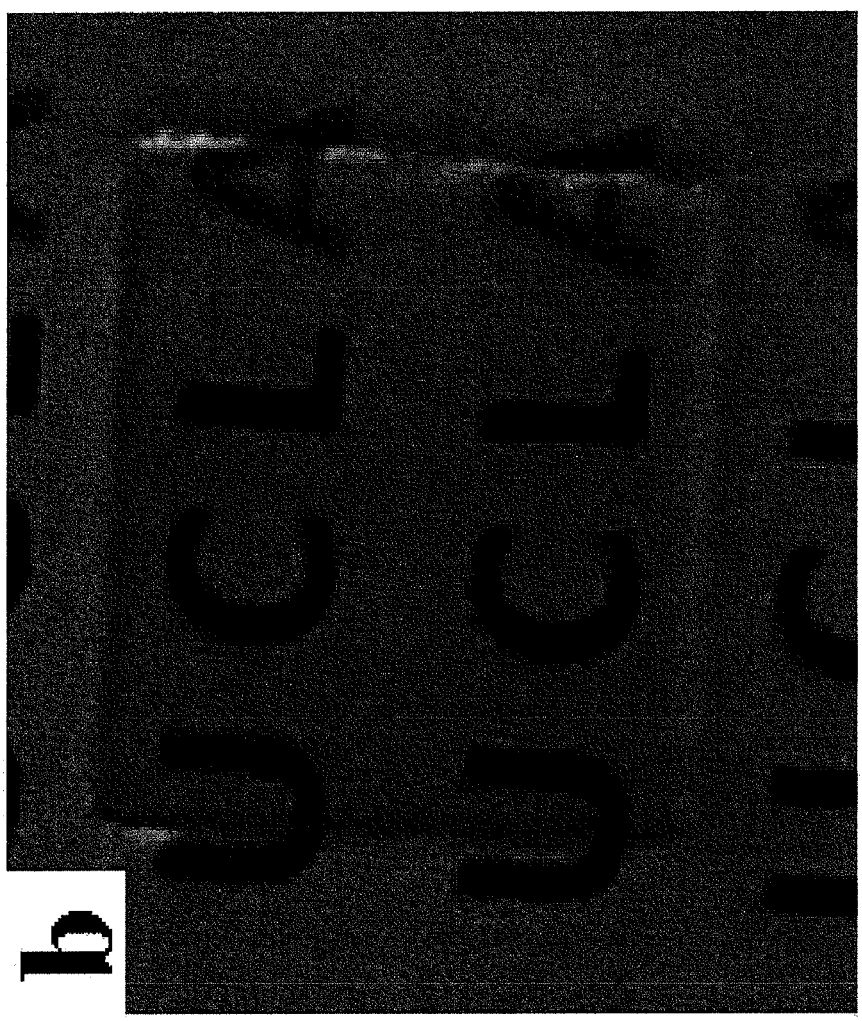
FIG. 5B shows a photo image of the $TiO_2$ film with 80 nm thickness.

To evaluate film properties, transmission and surface resistance are determined. FIG. 5 shows the typical optical transmission spectra of $TiO_2$ films with different thickness on glass as the optical reference. High transmission values, over 90%, are obtained for the three samples in the visible range (at the range of 400-700 nm, FIG. 5A) and extend into infrared. A photo of the $TiO_2$ film is shown in FIG. 5B. The transmittance of $TiO_2$ nanofilm is dependent on its thickness. It is found that, the higher than 95% transmission has been observed for the 40 and 80 nm NC films, the curves overlap, which is probably a limitation of the instrument. For the 160 nm film, the transmission is about 94%. High transmittance of the film ensures abundant photon transfer through the window layer and promotes external quantum efficiency (EQE) and short circuit current (Jsc) performance. Also, the sharp absorption onset indicates good optical quality and low concentration of defects such as pits or voids for the $TiO_2$-film, which is in agreement with film morphology characterized by SEM (FIG. 4). The surface resistances of $TiO_2$ films with different thicknesses were measured through the regular two-point probe method. All of the values obtained were determined approximately to be 30 MΩ, which is independent on the thickness, further indicating the uniformity of the as-formed $TiO_2$ films.

Replacement of i-ZnO Layer with $TiO_2$ Nanocrystals Film $TiO_2$ Based $CuInS_xSe_{1-x}$ Device with Variable Thickness The use of the sol-gel TiO2 nanocrystals as the window layer to replace the sputtered i-ZnO for CuInSeS absorber solar cell was investigated by comparing their performance. In brief, the device fabrication procedure is sequentially deposited with Mo substrate, $CuInS_xSe_{1-x}$ absorber layer, CdS buffer layer, $TiO_2$ or i-ZnO layer, and ITO layer, as shown in FIG. 2. The $CuInS_xSe_{1-x}$ absorber layer in the attempted devices was annealed at 390° C. in an inert environment. Table 1 summarizes the dependence of the open circuit voltage (Voc), Jsc, fill factor (FF) and efficiency of the films as a function of the thickness of $TiO_2$ films, where the other parameters are fixed. According to Table 1, 40-nm and 80-nm $TiO_2$-based devices have an efficiency around 6%, which is comparable to the classical sputtered i-ZnO based device (baseline in Table 1). In addition, the above three devices exhibit similar performance of Voc, Jsc, FF, series resistance (Rs), and shunt resistance (Rsh), as the Voc ranging between 0.42 V-0.46 V, Jsc ranging between 23-27 mA/cm$^2$, FF of 52-60%, Rs is less than 10 Ωcm$^2$, Rsh is above 10$^3$ Ωcm$^2$. However, when the thickness of the $TiO_2$ layer was increased to 160 nm, the Rs rapidly increased to 39.78 Ωcm$^2$ and led to a remarkable decreased FF value of 21.99% with a decreased efficiency of 2.2%. The increased Rs in the 160-nm $TiO_2$ nanocrystals based device is mainly ascribed to the thickness-dependent vertical resistance, as the surface resistance among the varied $TiO_2$ film thickness kept unchanged. Previous reports suggest thickness-dependent transmittances may also affect the overall efficiency by tuning the Jsc value of the device performance. However, in current devices, Jsc slightly decreases when the thickness is increased (from 26.34 mA/cm$^2$ through 25.41 mA/cm$^2$ to 24.16 mA/cm$^2$) when the thickness is varied from 40 through 80 to 160 nm. The results above suggest that thickness-dependent resistance Rs of $TiO_2$ nanofilm, other than transmittance, is the key parameter to influence the conversion efficiency.

TABLE 1

Summary of photovoltaic properties comparison of different cells

| | Voc (V) | Jsc (mA/cm$^2$) | FF (%) | Eff (%) | Rs (ohm * cm$^2$) | Rsh (ohm * cm$^2$) |
|---|---|---|---|---|---|---|
| Baseline | 0.464 | 23.13 | 59.85 | 6.42 | 2.16 | 3.98 * 10$^3$ |
| TiO$_2$ (40-nm) | 0.452 | 26.34 | 52.08 | 6.2 | 5.54 | 4.20 * 10$^3$ |
| TiO$_2$ (80-nm) | 0.466 | 25.41 | 53.47 | 6.33 | 6.02 | 2.61 * 10$^5$ |
| TiO$_2$ (160-nm) | 0.413 | 24.16 | 21.99 | 2.2 | 39.78 | 1.63 * 10$^5$ |
| Without i-ZnO | 0.289 | 23.59 | 25.13 | 1.71 | | 8.55 |
| TiO$_2$ (40 nm, RTA) | 0.496 | 27.53 | 67.13 | 9.17 | 2.1 | 8.46 * 10$^5$ |
| Baseline (RTA) | 0.491 | 26.80 | 65.65 | 8.63 | 2.02 | 1.33 * 10$^4$ |

$TiO_2$ Based $CuInS_xSe_{1-x}$ Device with Different Morphology

Figure 6A:
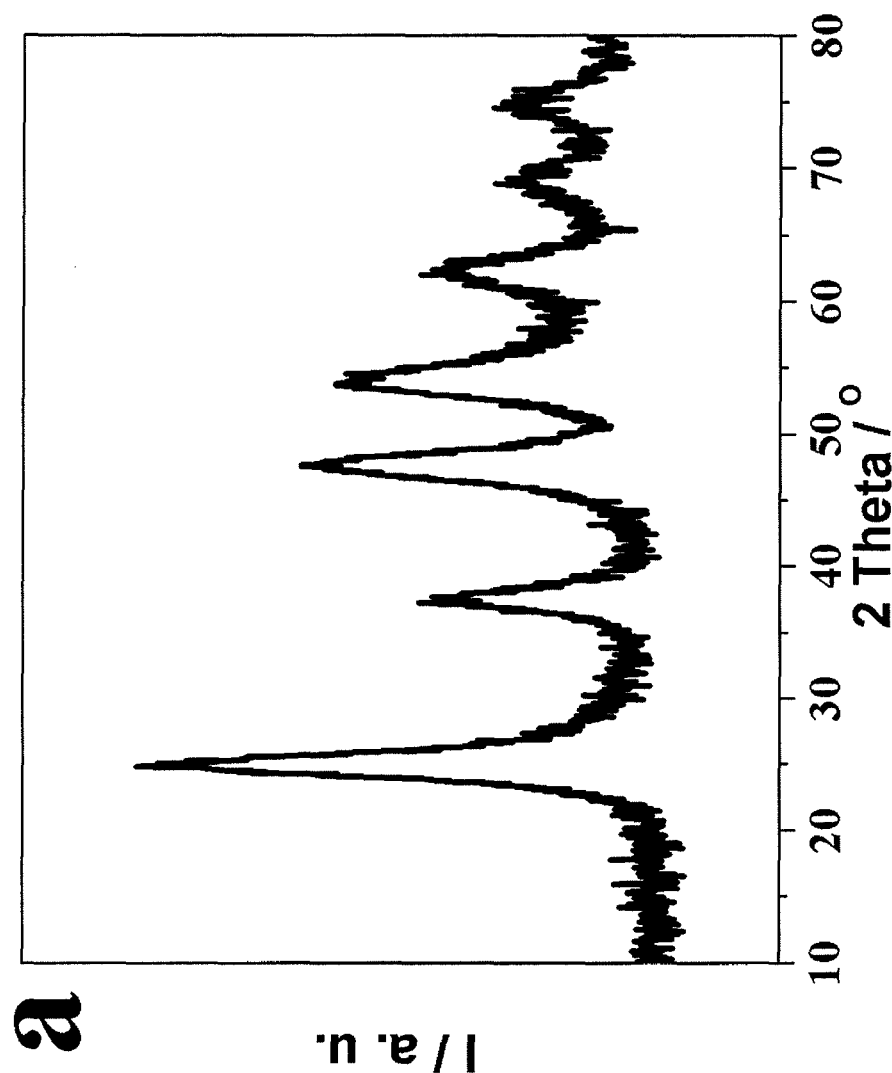
FIGS. 6A and 6B show the as-prepared $TiO_2$ nanocrystals obtained by 9 h reaction time: a) XRD pattern; b) TEM image.
Figure 6B:
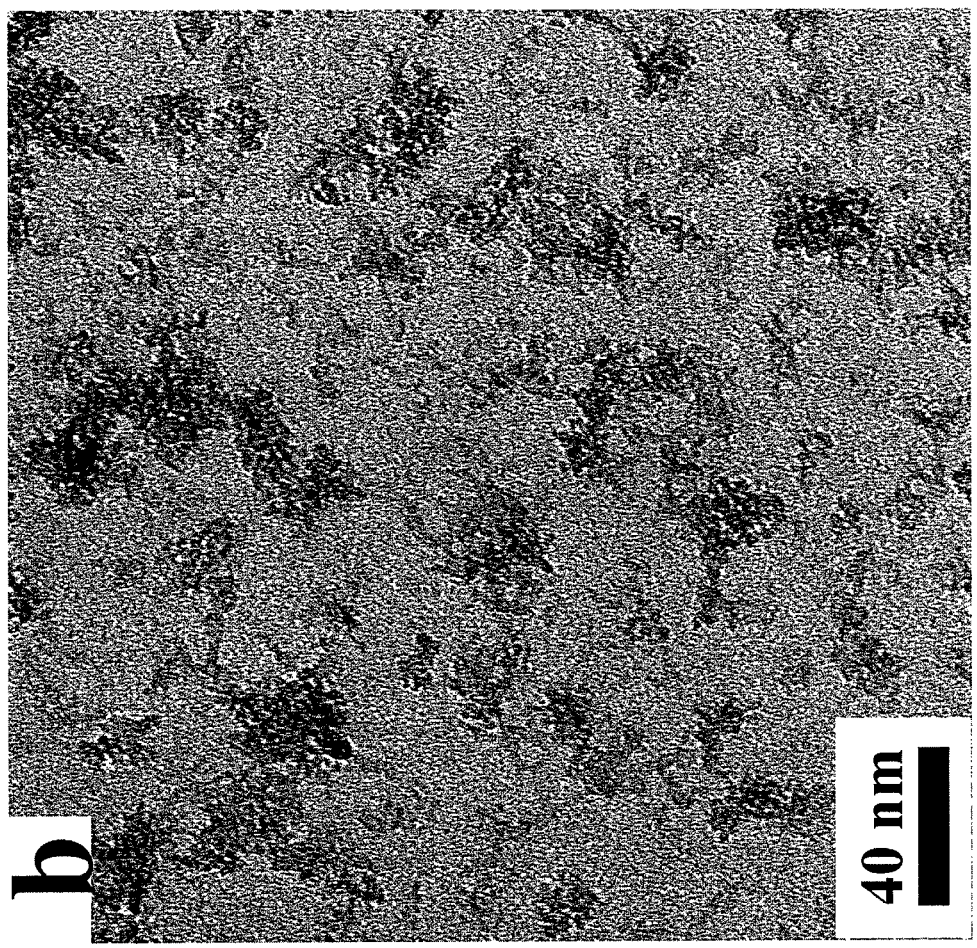
Figure 7A:
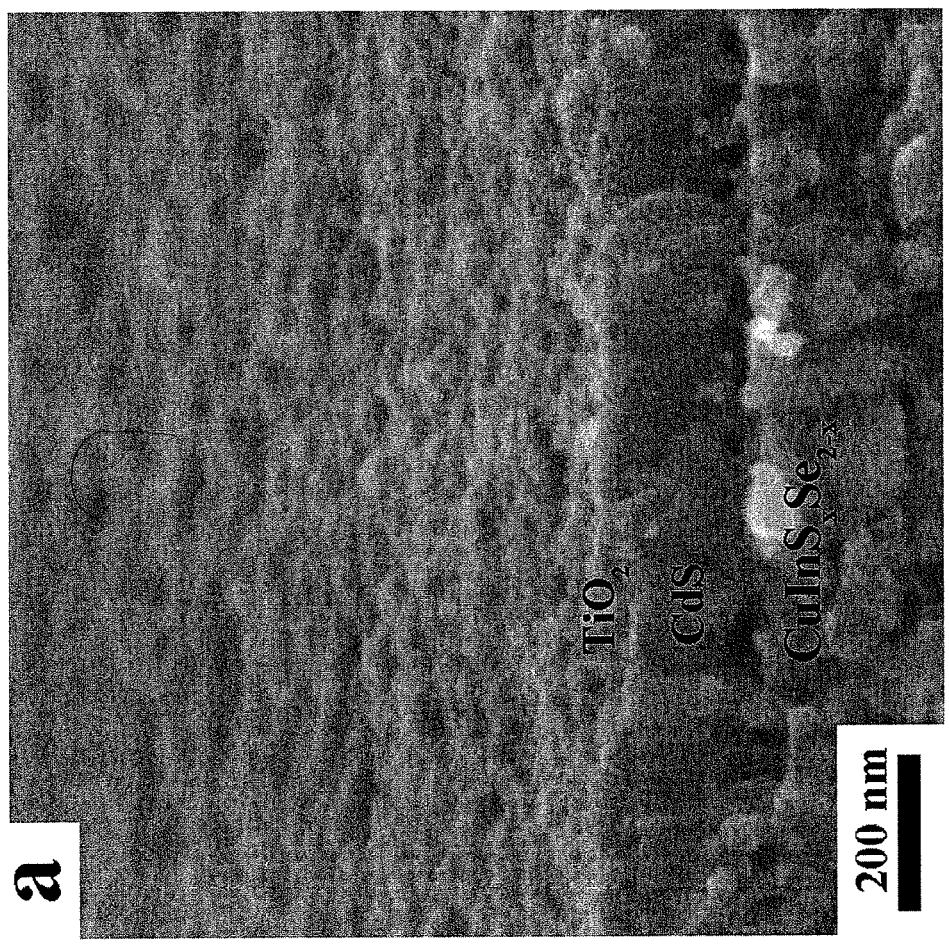
FIGS. 7A and 7B show SEM images of the $TiO_2$ nanocrystal film on CdS layer: a) 15 h reaction time; b) 9 h reaction time.
Figure 7B:
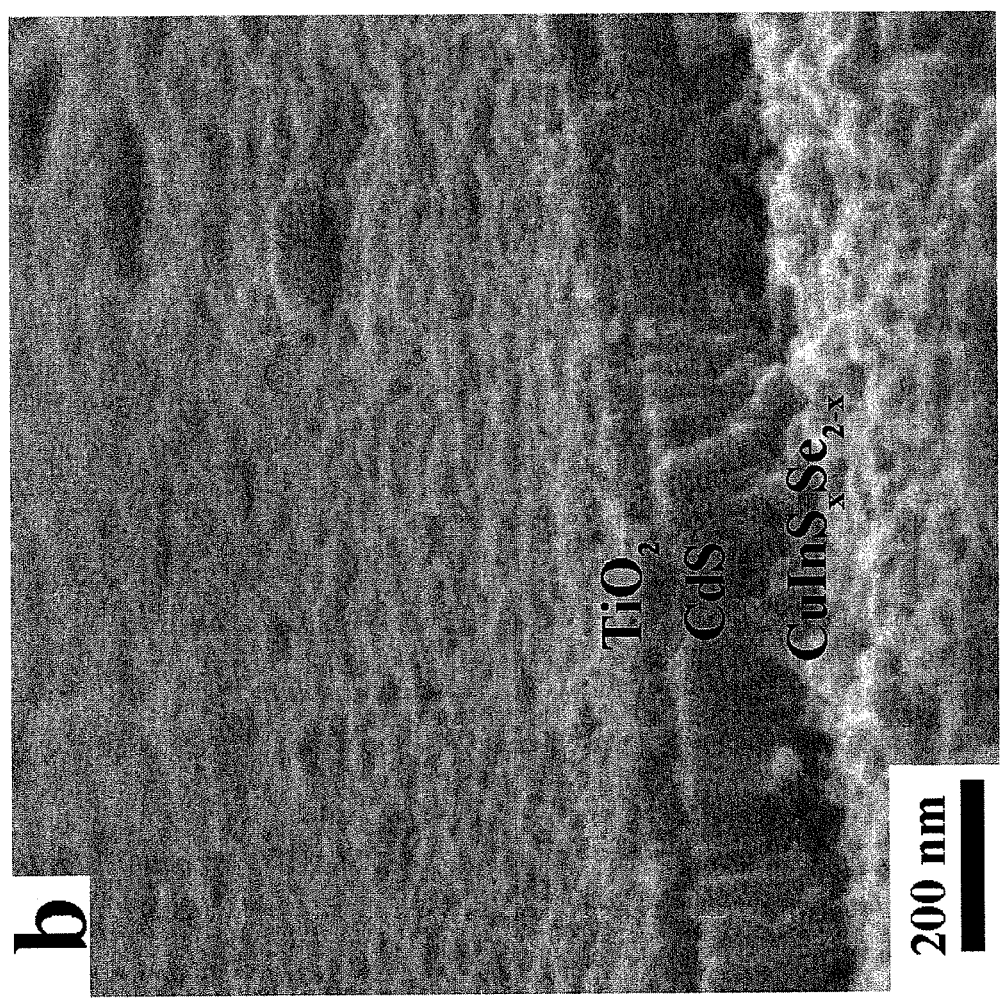

Different $TiO_2$ nanocrystals were also tested to clarify the effect of the $TiO_2$ nanomaterials. $TiO_2$ nanocrystals prepared at shorter reaction time of 9 h were used in the control experiment. As shown in FIGS. 6A and 6B, the 9 h sample shows similar anatase phase of $TiO_2$, but a broaden diffraction peak with the smaller particle size of 5 nm, as compared with 15 h sample. According to the TEM image, there is slight cross linkage among the individual nanocrystals, which is in agreement with reports in the literature. TiO$_2$ nanocrystals obtained from 9 h reaction time, were assembled into a nanofilm in the window layer, with device treatment conditions fixed the same as utilized above. We have made more than 10 nominally identical devices for each kind of TiO$_2$ nanocrystals, and the performance is shown in Table 2. The short reaction time TiO$_2$ nanocrystals, eg 9 h, -based solar cell showed a Voc ranging between 0.39-0.45 V, Jsc ranging between 16.5-26 mA cm$^{-2}$, and FF of 21%-50%, mostly 25%. The as measured solar power-conversion efficiencies ranged from 1.7%-3.2%. While the Voc, Jsc and FF of longer reaction time, eg 15 h, TiO$_2$ nanocrystals based solar cell were increased, with the value ranging between 0.45-0.47 V, 20-24 mA cm$^2$, and 60%-63%, respectively. The as resulted efficiencies ranged from 5.5%-7.0%, which is much higher than the 9-hour TiO$_2$ nanocrystals based solar cell. Different device features were as ascribed to larger Rs and smaller Rsh manifested in 5-nm TiO$_2$ nanocrystal-based solar cell. Film quality, especially nanoscaled particle spacing in compact and dense film, strongly affect the resistance of as obtained device. Although nano-scaled film morphology is difficult to be determined by SEM owing to its low spatial resolution (FIG. 7), TEM image may also reveal some evidences to the different aggregation behavior of TiO$_2$ nanocrystals. According to TEM characterization, cross linkage exists in the 9-hour TiO$_2$ nanocrystals, while the larger TiO$_2$ nanocrystals, fabricated after 15-hour reaction, show better dispersability and less particle linkage. Long reaction time produces intact exterior surfaces, and decreases surface defects, thus lowering the particle aggregation at defect surface. This will result in a more densely packed TiO$_2$ film for the 15-hour samples. This difference suggests that the TiO$_2$ nanocrystals with good dispersability can be a key parameter to film quality and hence device behavior.

TABLE 2

Summary of the photovoltaic property of the device made from 9 h TiO$_2$ nanoparticles and 15 h TiO$_2$ nanoparticles

| Device | Voc (V) | Jsc (mA/cm$^2$) | FF (%) | Eff (%) |
| --- | --- | --- | --- | --- |
| 1 (9 h reaction time) | 0.396 | 25.92 | 24.96 | 2.56 |
| 2 (9 h reaction time) | 0.393 | 14.21 | 21.38 | 1.19 |
| 3 (9 h reaction time) | 0.434 | 19.46 | 25.33 | 2.14 |
| 4 (9 h reaction time) | 0.348 | 30.77 | 29.63 | 3.17 |
| 5 (9 h reaction time) | 0.370 | 20.53 | 22.60 | 1.72 |
| 1 (15 h reaction time) | 0.453 | 19.90 | 60.83 | 5.49 |
| 2 (15 h reaction time) | 0.450 | 19.56 | 61.80 | 5.45 |
| 3 (15 h reaction time) | 0.456 | 22.78 | 60.03 | 6.24 |
| 4 (15 h reaction time) | 0.457 | 21.80 | 60.72 | 6.04 |
| 5 (15 h reaction time) | 0.465 | 23.63 | 62.98 | 6.92 |

Optimized TiO$_2$ Based CuInS$_x$Se$_{1-x}$ Device

Figure 8A:
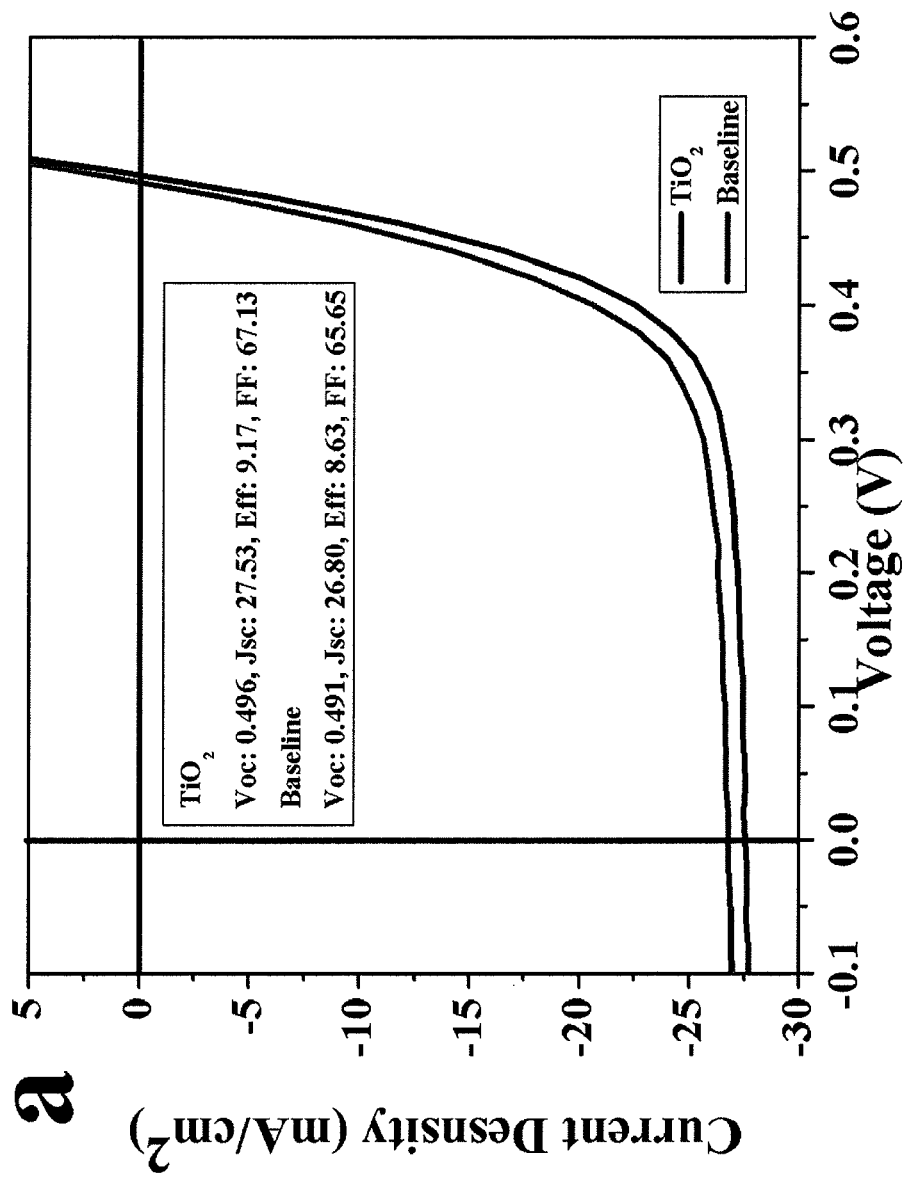
FIG. 8A shows J-V curve comparison of $TiO_2$ based device and baseline device.
Figure 8B:
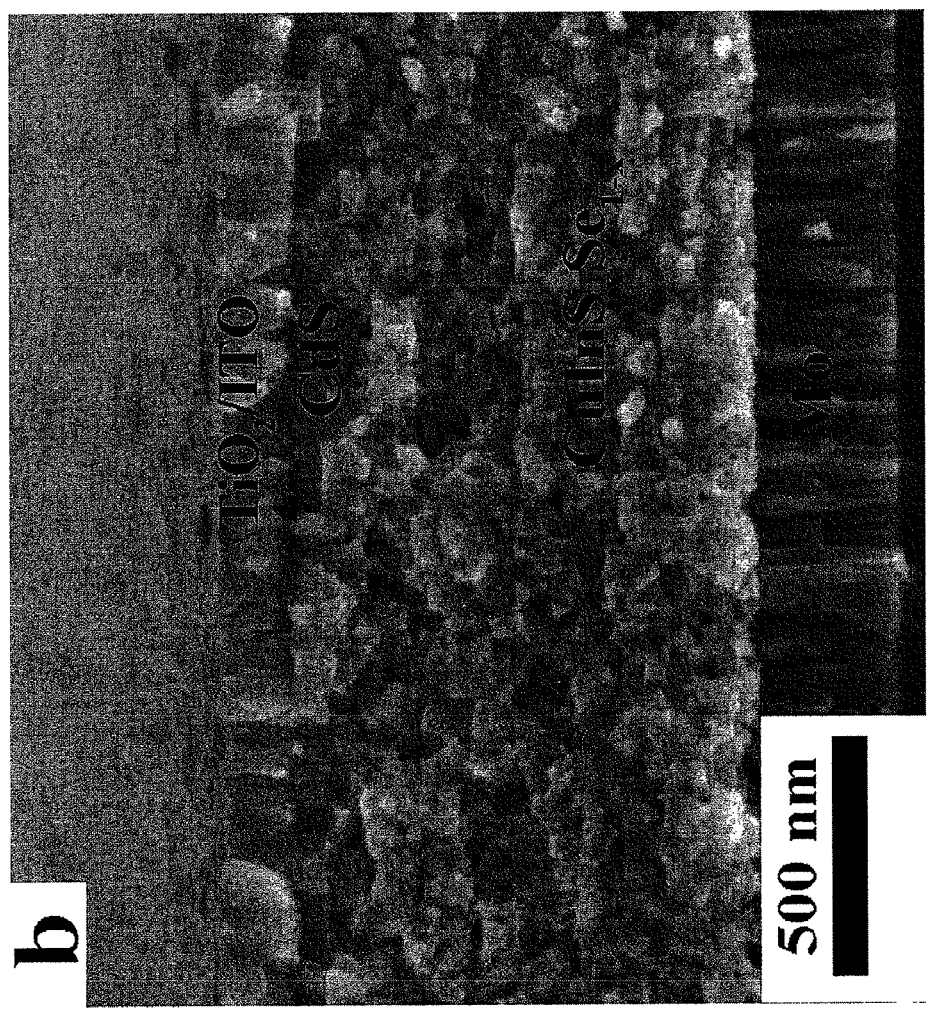
FIG. 8B shows SEM cross section of $TiO_2$ based device structure.

Based on the above results, the device optimization was attempted through depositing 1 layer of TiO$_2$, meanwhile, the CuIn(S,Se)$_2$ absorber layer was treated with a rapid thermal annealing (RTA) process to promote the crystal growth of CuIn(S,Se)$_2$ and reduce the carrier recombinations. Depending on the details of treatment conditions, more than 10 identical TiO$_2$ based solar cells showed a Voc ranging between 0.49-0.51 V, Jas ranging between 18-28 mA cm$^{-2}$, FF of 65%-70%, and efficiencies ranged from 7.5% to 9.2%, where the performance of selected 3 typical cells is shown in Table 3 and FIG. 8. A champion device presented in FIG. 8A has an efficiency of 9.2% (Voc: 0.496V, Jsc: 27.53 mA/cm2, FF: 67.13%). The SEM cross-section image of the best performance cell is shown in FIG. 8B. It is obvious that the Mo, CISS, CdS, TiO$_2$ and ITO layers are deposited sequentially from bottom to the top. The thickness of the TiO$_2$ layer is around 40 nm.

Comparison of TiO$_2$-Based and i-ZnO-Based CuInS$_x$Se$_{1-x}$ Device

To gain insight into the high conversion efficiency of the TiO$_2$-based CISS solar cell, comparison on device performance has been made among TiO$_2$—, i-ZnO-based, and CISS solar cells without ZnO. The presence of the i-ZnO layer is beneficial to preserve the heterojunction beneath between CISS and CdS, during cell fabrication, which in turn prevents shunting performance of the device. As summarized in Table 1, the absence of the i-ZnO layer dramatically decreases the efficiency to 1.71%, as a result of decreased Rsh from above 10$^3$ to 8.55 Ωhm*cm$^2$. The decreased Rsh further produced a decreased Voc and FF value from 0.464 to 0.289 V, and 59.85% to 25.13%, respectively, which in turn leads to the low efficiency. Widely used sputter-deposited ZnO in CISS-solar cells also takes advantage of a suitable band gap of 3.5 eV, essentially higher than 95% transmission at visible wavelength, and surface resistance above 10$^6$Ω. The band gap of 3.5 eV and high transmittance ensure an abundance of photons transmitted into the CuIn(S,Se)$_2$ layer, and a conduction band offset within 0.4 eV between CdS and ZnO, facilitates electron extraction.

Figure 9:
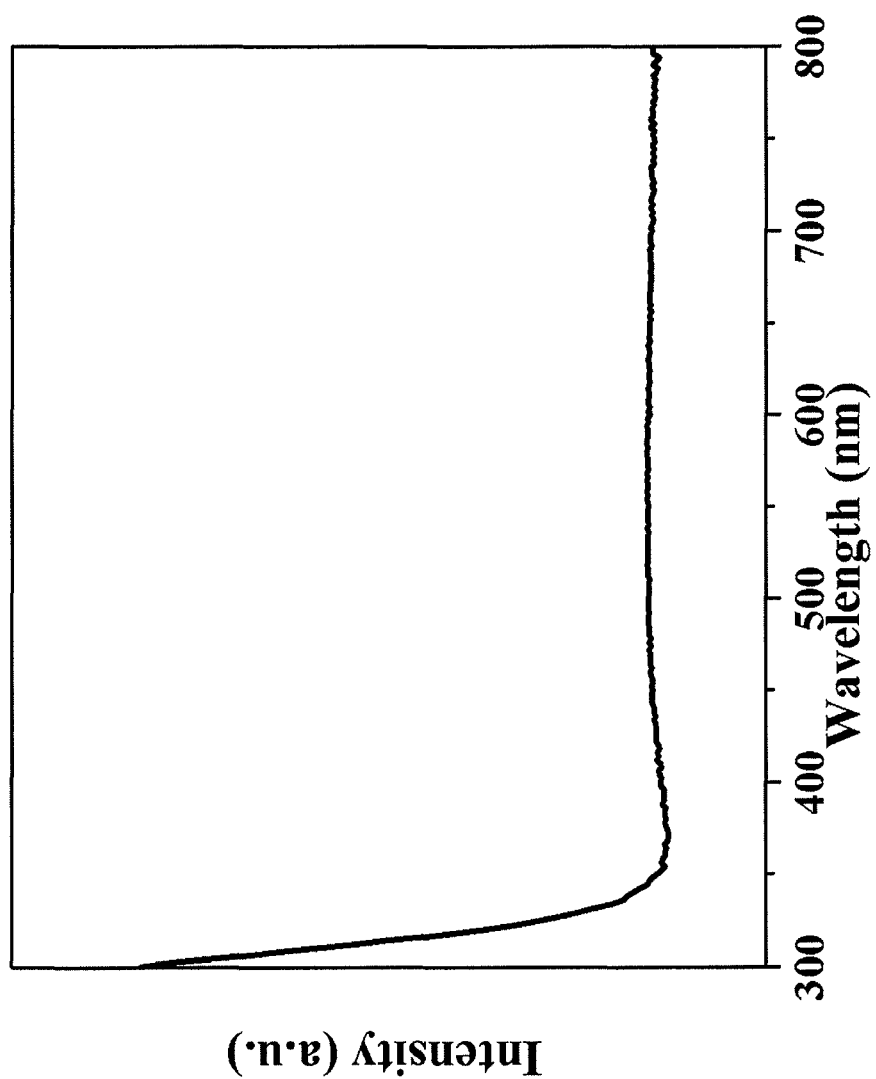
FIG. 9 shows the absorption of 80 nm-$TiO_2$ nanocrystal films.
Figure 10:
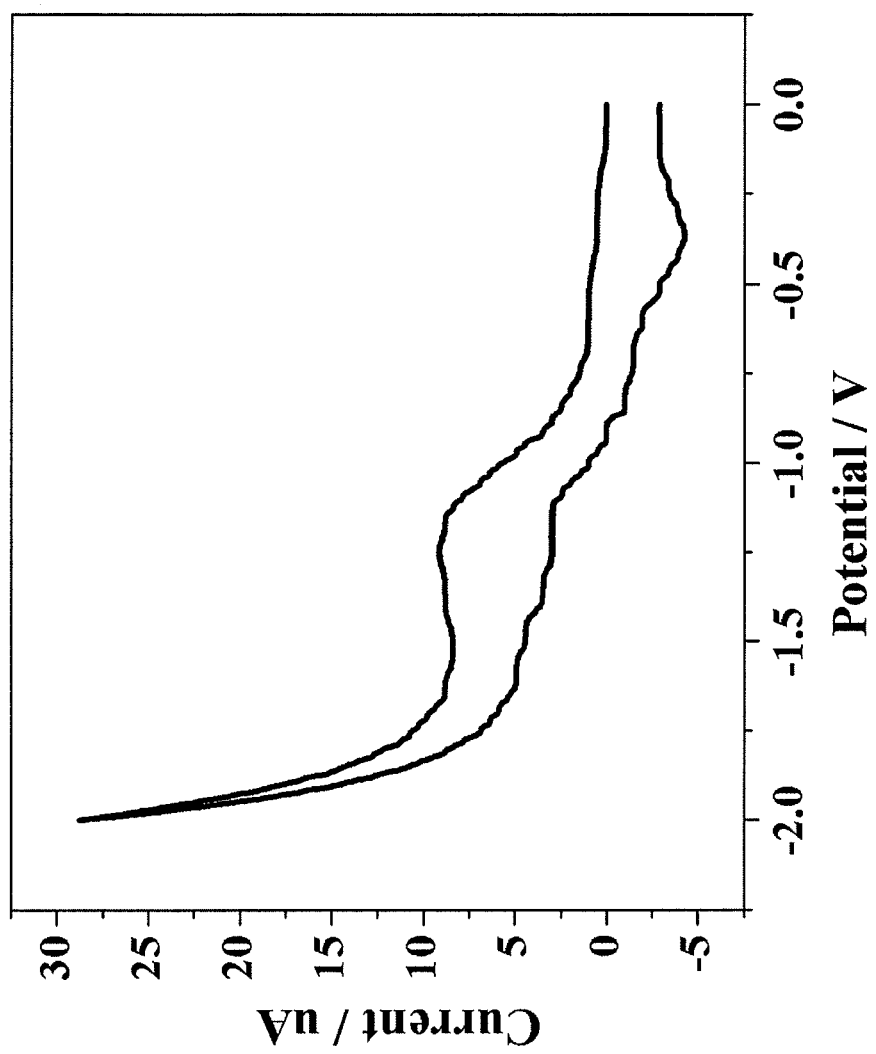
FIG. 10 shows the CV cyclic voltammetry curve of the as prepared $TiO_2$ nanocrystals, the reference electrode is Ag.

As mentioned above, the TiO$_2$ nanocrystals have up to 97% transmittance in the visible range, and the surface resistance is around 30 MΩ, which is similar to ZnO. The band gap of the TiO$_2$ nanocrystals can be measured from the absorption spectrum using the extrapolation of $((\alpha h v))^2$ vs hv to zero energy, which provides a value of 3.7 eV, as shown in FIG. 9. The conduction band of the TiO$_2$ nanocrystals was determined using cyclic voltammetry (CV). As shown in FIG. 10, the conduction band edge of the as-prepared TiO$_2$ nanocrystals was 3.7 eV, similar to ZnO, and matched the electron extraction from CdS layer to ITO electrode. Thus, material, such as the sol-gel processed TiO$_2$ nanocrystals, with similar band gap, especially conduction band maximum and valence band maximum, good transparency, and comparable surface resistance, may be suitable for window layers to replace the sputtered ZnO in CuIn(S,Se)$_2$.

Figure 8C:
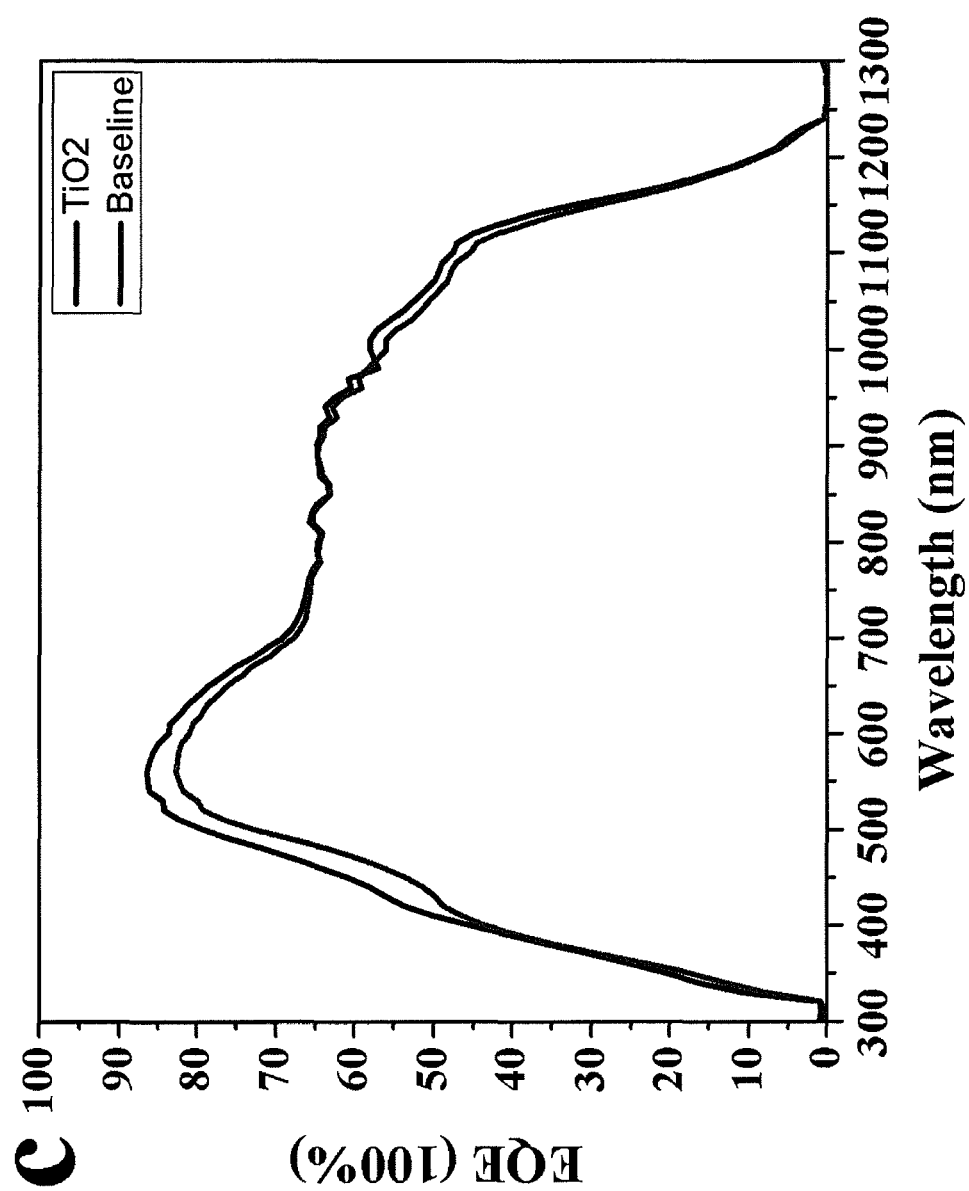
FIG. 8C shows EQE comparison of $TiO_2$ based device (upper curve) and baseline device (lower curve)
Figure 11:
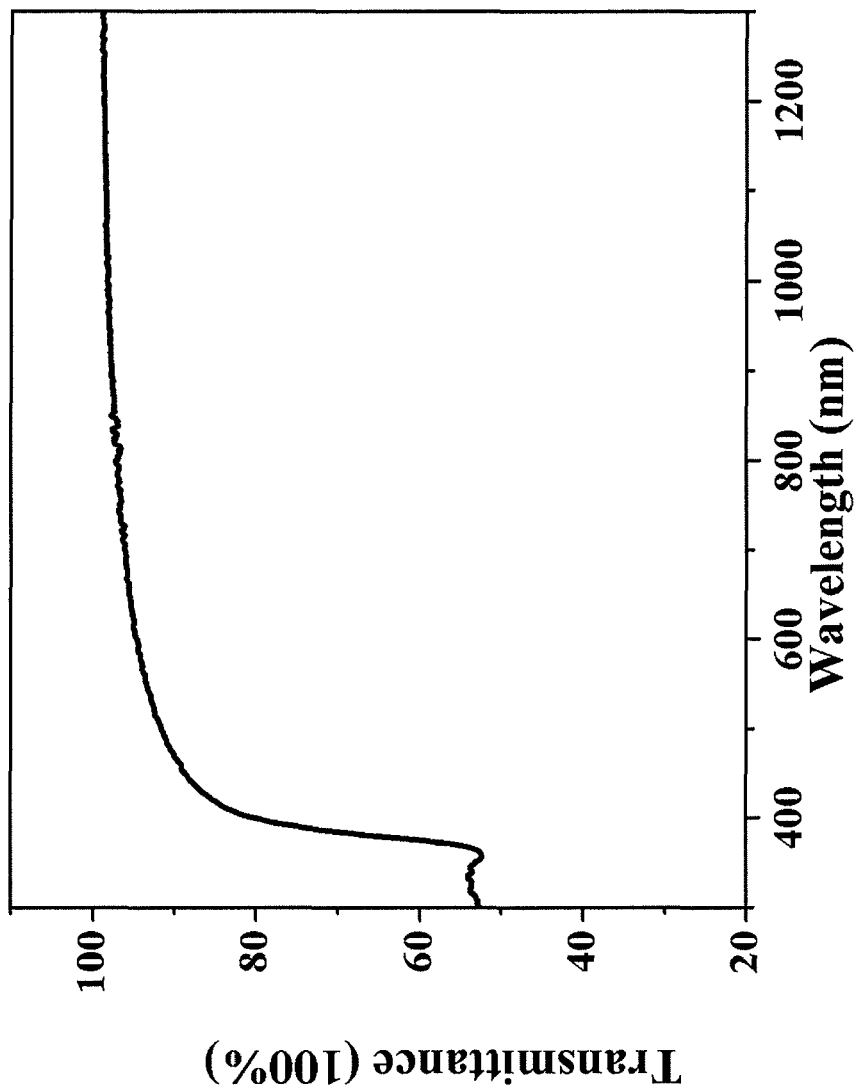
FIG. 11 shows transmittance spectrum of sputtered i-ZnO film with 50 nm thickness.

Under the fixed parameter in the best TiO$_2$ based cell, the efficiency of ZnO based device ranging from 7.5% to 8.6%, and the champion device yields a Jsc, Voc, FF, and PCE values of 26.80 mA/cm$^2$, 0.491V, 65.65% and 8.63%, respectively. It is noted that, the champion TiO$_2$ based cell has a slightly increased Jsc, and FF, which turn to an enhanced efficiency. The Jsc of these two cells was verified by the EQE spectra. As shown in FIG. 8C, compared with ZnO based structures, the TiO$_2$ based structures shows higher EQE in the visible region of 400-700 nm, and essentially no difference above 700 nm. This can be attributed to the good absorption in the TiO$_2$ based structures as evidenced by the higher transmittance compared to ZnO based structures, as shown in FIG. 4A and FIG. 11. The device performance comparison indicates the TiO$_2$ nanocrystals based-devices are comparable or even better than those for equivalent cells made with classical intrinsic ZnO as the window layer. The good performance of the TiO$_2$ nanocrystals based cell can be ascribed to the suitable band gap, the good transparency, the larger resistance, especially the high quality film composed of uniform TiO$_2$ nanocrystals.

Figure 12:
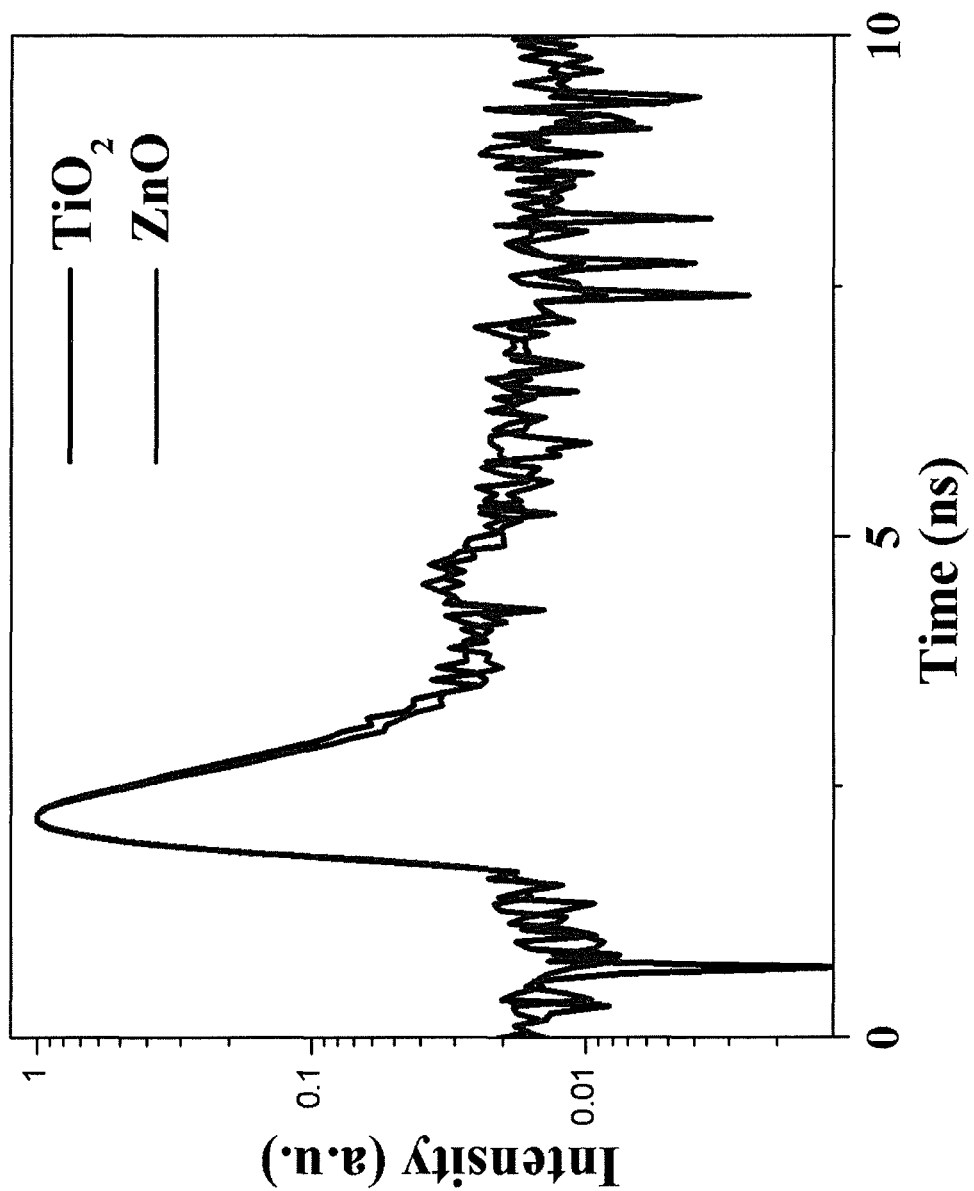
FIG. 12 shows a comparison of time evolution of the room-temperature PL emission spectra of $CuInS_xSe_{1-x}$ film, black line and red line represents $TiO_2$ or i-ZnO based device respectively.

Minority carrier lifetime was also compared between these two cells, which is expected to play an important role on the conversion efficiency of the solar cell. Minority carrier lifetime is a direct measurement of various radiative and nonradiative relaxation efficiency for the photo-excited carries. In the current examples, minority carrier lifetime is obtained from time-resolved photoluminescence (PL) emission profiles at low-injection levels. FIG. 12 depicted the time evolution of the photoluminescence signals detected at the maximum of the PL emission, for the champion $TiO_2$ based and ZnO based samples. As indicated in FIG. 12, the lifetime for both cells is approximately the same, with $\tau$<1 ns. The minority carrier lifetime preserves similar values regardless of window layer materials, which is indirect evidence for the independence between carrier lifetime and Jsc, as reported by Ohnesorge et al.[13] This result also suggests that the minority carrier lifetime is not responsible for the difference of the device performance in the present examples.

Stability Test for Optimized $TiO_2$-Based Solar Cell

Figure 8D:
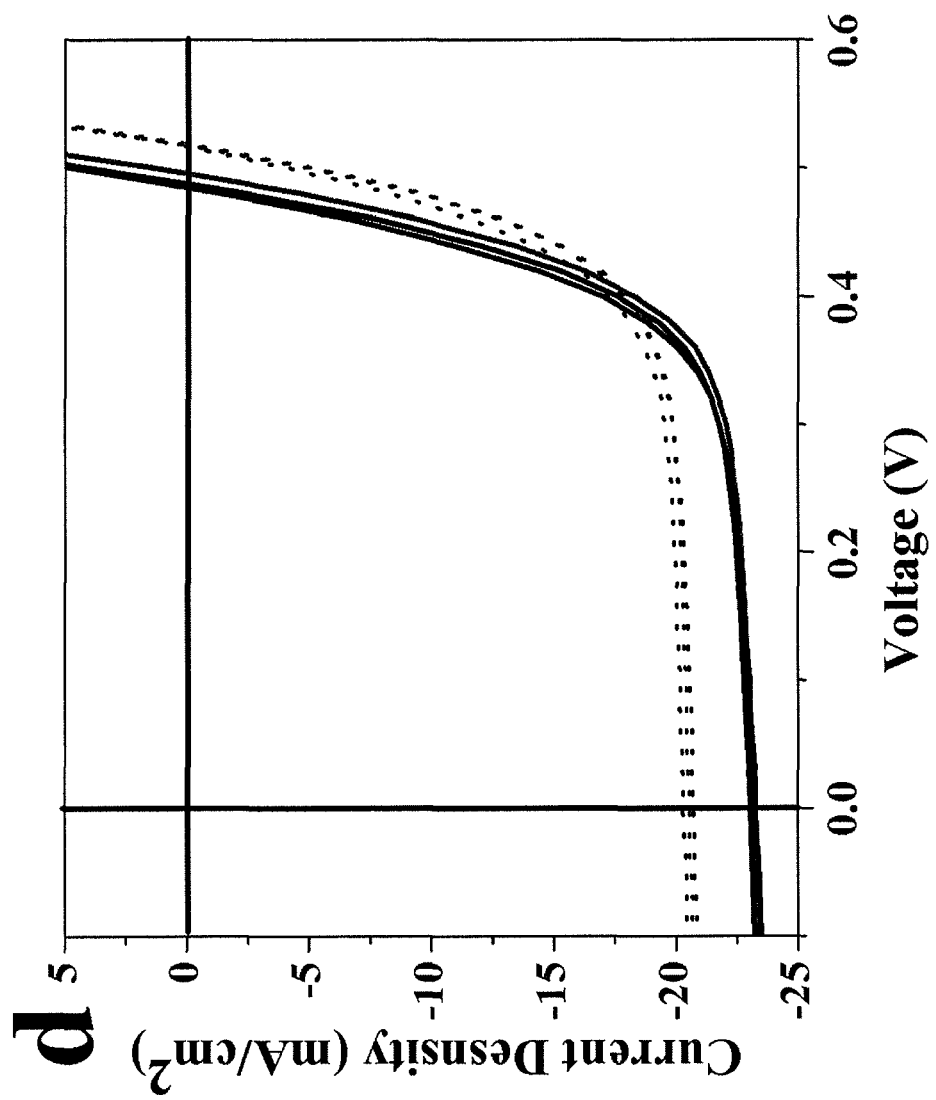
FIG. 8D show stability of the $TiO_2$ based device, the solid line and domed line represents the as-made device and the device after 2 month placing in ambient environment, blue (upper on right), red (bottom) and black (middle) color represents sample 1, 2, and 3 in Table 3, respectively.

The stability performance of the $TiO_2$-based device under ambient atmosphere has been studied. The current density-voltage characteristics of 3 typical cells were measured after placing in ambient atmosphere for 2 month. FIG. 8D shows the J-V curve tested before and after 2 month, where the photovoltaic properties are summarized in Table 3. The PCE for the as-made 3 cells is 7.67%, 7.84%, 7.98%, respectively. After 2 month, the PCE is approximately kept at the same level, with a slightly lower efficiency of 7.35%, 7.73%, 7.60%, respectively. According to the detail photovoltaic measurements, it can be seen that the Voc has been increased slightly, while the Jsc was decreased, which combined resulting in a basically retentive device performance. Usually, the slightly degradation of the performance can be ascribed to $H_2O$ and $O_2$ effect, but the reason for the slightly increased Voc is still under investigating in our group. The $TiO_2$ based device exhibits good photovoltaic stability under ambient atmosphere, further proves the possibility of replacing i-ZnO as the window layer.

TABLE 3

Summary of the photovoltaic stability property of three different $TiO_2$ based cells

| Device | Voc (V) | Jsc (mA/cm$^2$) | FF (%) | Eff (%) |
| --- | --- | --- | --- | --- |
| 1 | 0.485 | 24.74 | 63.93 | 7.67 |
| 1 after 2 month | 0.517 | 21.53 | 66.12 | 7.35 |
| 2 | 0.485 | 24.74 | 63.93 | 7.84 |
| 2 after 2 month | 0.519 | 22.03 | 67.62 | 7.73 |
| 3 | 0.496 | 24.54 | 65.60 | 7.98 |
| 3 after 2 month | 0.518 | 22.02 | 66.67 | 7.60 |

Conclusion

In these examples, we have demonstrated that solution-processed $TiO_2$ nanocrystals can be used as the substitute of the sputtered ZnO in thin film solar cells according to an embodiment of the current invention. The $TiO_2$ nanocrystals are prepared through a modified sol-gel process, with good particle dispersity, and size distribution. A continuous film can be made from compact assembly of $TiO_2$ nanocrystals, and possesses comparable electronic and optical properties with sputtered i-ZnO, suggesting a potential window layer in CISS device. Interparticle linkage between $TiO_2$ nanocrystals may produce unwanted nanoscaled spacing in the continuous film, and hence decrease the device performance. The thickness of $TiO_2$ nanocrystals will directly affect the transmittance of the film, and the Rs, which in turn influence the overall device performance. Increasing the thickness from 40 nm to 160 nm decreases the conversion efficiency from 6.2% to 2.2%. Optimized devices from $TiO_2$ exhibit performance (9.17%) comparable or even higher than the typical intrinsic zinc oxide (ZnO) layer that is used in traditional CISS devices. By virtue of the water resistance of $TiO_2$ nanocrystals, the resulting device exhibits stable performance up to 2 months. This low temperature, solution-based methods of $TiO_2$ for i-ZnO layer, together with replacement of ITO with other solution-processed materials, benefit from a variety of inexpensive materials, such as nickel oxide, indium oxide, and their mixture for low-cost high-efficiency solar cells, ranging from $CuInS_2$ to $Cu(InGa)Se_2$, and $CuZnSnS_4$.

Experimental

Materials:

All chemicals were purchased from sigma-Aldrich and used as received.

Precursor Solution Preparation:

All the solution preparation detail has been reported in the previous literature. In brief, 0.5 M $Cu_2S$ solutions were prepared by dissolving 2 mmol of copper sulfide and 4 mmol of sulfur in 4 mL of hydrazine with continuous stirring for several days. Similarly, 0.25 M $In_2Se_3$ were prepared by dissolving 1 mmol of indium selenide ($In_2Se_3$) and 1 mmol of selenium into 4 mL of hydrazine with continuous stirring. After filtering to remove any insoluble species, the $Cu_2S$ solution and $In_2Se_3$ solution with the ratio of $M_{Cu}:_{In}$=1:1.2 were mixed to form the precursor solution.

Synthesis of $TiO_2$ Nanocrystals:

The $TiO_2$ nanocrystals were obtained from a non-hydrolytic sol-gel approach[12]. In a typical procedure, 0.5 mL $TiCl_4$ was slowly added into 2 mL ethanol, followed by mixing with 10 mL benzyl alcohol, leading to a yellow solution. The solution was heated in a period of 15 h, forming a white suspension. The $TiO_2$ precipitate was collected by centrifuging the crude product two times by using diethyl ether. The final $TiO_2$ solution was prepared by dispersing it in ethanol, with the concentration of 8 mg/mL.

Device Fabrication:

Fabrication of i-ZnO Based CISS Film.

The fabrication of typical intrinsic zinc oxide (ZnO) layer based device was followed the published method.[14]

Fabrication of $TiO_2$-Film Based CISS Film.

The fabrication process of the photovoltaic cell was similar as the reported literature, except the deposition of $TiO_2$ nanocrystals, other than sputtering of ZnO as the window layer. The typical procedure was as followed: First, deposition of molybdenum (Mo, around 300 nm) onto a Corning 2947 glass side by argon dc sputtering. Then, the $CuInS_xSe_2$-x layer with the thickness of around 1 um was deposited onto the Mo layer by spin-coating the precursor solution several times, followed by thermal annealing at 390° C. for 30 min and rapid thermal annealing at 600 for 10 min. Next, the cadmium sulfide (CdS) layer was deposited onto $CuInS_xSe_2$-x layer by chemical bath deposition. Subsequently, $TiO_2$ nanocrystals (8 mg/mL) were deposited as a window layer by spin-coating several times, with annealing at 150° C. for 10 min. Finally, 120 nm of indium tin oxide (ITO) was deposited by argon rf sputtering, and served as the top transparent electrode. The area of each cell was 0.12 cm$^2$.

Characterization:

The photovoltaic performance was characterized in air without any encapsulation under an AM1.5G filter at 100 mW/cm$^2$ using a Newport Oriel 92192 Solar Simulator, as calibrated using a Si photodiode. The XRD patterns were collected on a PANalytical X'Pert Pro X-ray Powder Diffractometer using Cu—Ka radiation ($\lambda$=1.54050 Å). The scanning electron microscope (SEM) images were taken on a Joel JSM-6700F with an accelerating voltage of 5 kV. TEM images were taken on FEI CM 120 microscope operated at 120 kV. The transmittance and absorption spectra were taken using a Hitachi ultraviolet_visible spectrophotometer (U-4100). The surface resistance of $TiO_2$ nanocrystals film was measured by using two-point probe method (regular multimeter). Optical transmission measurements were carried out using a Jasco V-570 spectrophotometer. Spectra were recorded at room temperature, with a scanning speed of 100 nm/min. Cyclic voltammetry (CV) measurement was carried out by using a C3 cell stand (Bioanalytical Systems, Inc.) with model BAS 100 W electrochemical software. Electrochemical measurements were performed by using a conventional cell, with a glassy carbon electrode as the working electrode, a platinum electrode as the counter electrode, and Ag as the reference electrode. The carrier lifetime is measured by time-resolved photoluminescence (TRPL) using Picoharp single counting system. A 635 nm semiconductor laser with a pulse width less than 0.2 ns and with repetition rate of 20 MHz is employed as excitation source. Photoluminescence signal from the samples is detected by a Hamamatsu H10330A photomultiplier tube cooled down to −60° C. during operation. The stability measurement for the devices, which was placed in ambient environment for 2 month, was under the condition of 85° C., 100% humidity.

REFERENCES

[1] M. H. Park, J. H. Li, A. Kumar, G. Li, Y. Yang, *Adv. Funct. Mater.*, 2009, 19, 1241.
[2] F. F. Gao, Y. Wang, D. Shi, J. Zhang, M. K. Wang, X. Y. Jing, R. Humphry-Baker, P. Wang, S. M. Zakeeruddin, M. Gratzel. *J. Am. Chem. Soc.*, 2008, 130, 10720.
[3] Y. L. Lee, Y. S. Lo, *Adv. Funct. Mater.*, 2009, 19, 604.
[4] A. L. Linsebigler, G. Q. Lu, J. T. Yates, *Chem. Rev.* 1995, 95, 735.
[5] M. Ni, M. K. H. Leung, D. Y. C. Leung, K. Sumathy. *Renew. Sust. Energy Rev.* 2007, 11, 401.
[6] Q. Wang, S. Ito, M. Graltzel, F. Fabregat-Santiago, I. Mora-Sero. J. Bisquert, T. Bessho, H. Imai, *J. Phys. Chem. B.* 2006, 110, 25210.
[7] B. O'Regan, M. Grätzel. *Nature* 1991, 353, 737.
[8] A. Rockett, R. W. Birkmire, *J. Appl. Phys.* 1997, R81, 70.
[9] W. Liu, D. B. Mitzi, M. Yuan, A. J. Kellock, S. J. Chey, O. Gunawan, *Chem. Mater.*, 2010, 22, 1010; b) T. K. Todorov, O. Gunawan, T. Gokmen, D. B. Mitzi, *Prog. Photovolt: Res. Appl.* DOI: 10.1002/pip.1253.
[10] U. Rau, M. Schmidt, *Thin Solid Films,* 2001, 387, 141.
[11] A. Hagfeldt, M. Gratzel, *Chem, Rev.* 1995, 95, 49.
[12] J. Wang, J. Polleux, J. Lim, B. Dunn, *J. Phys. Chem. C* 2007, 111, 14925.
[13] B. Ohnesorge, R. Weigand, G. Bacher, A. Forchel, *Appl. Phys. Lett.*, 1998, 73, 1224.
[14] W. W. Hou, B. Bob, S. H. Li, Y. Yang, *Thin Solid Films* 2009, 517, 6853.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A metal-chalcogenide photovoltaic device, comprising:
a first electrode;
a photon-absorption layer above said first electrode; and
a window layer above said photon-absorption layer,
wherein said photon-absorption layer comprises a metal-chalcogenide semiconductor,
wherein said window layer comprises a layer of metal-oxide nanoparticles,
wherein at least a portion of said window layer provides a second electrode that is substantially transparent to light within a range of operating wavelengths of said metal-chalcogenide photovoltaic device,
wherein said layer of metal-oxide nanoparticles consists essentially of metal-oxide nanoparticles that are smaller than about 6.5 nanometers and larger than about 5.0 nanometers,
wherein said layer of metal-oxide nanoparticles is less than 85 nanometers thick and greater than 15 nanometers thick, and wherein said metal-oxide nanoparticles are titanium dioxide nanoparticles.

2. A metal-chalcogenide photovoltaic device according to claim 1, wherein said layer of metal-oxide nanoparticles consists essentially of metal-oxide nanoparticles that are about 6.3 nanometers.

3. A metal-chalcogenide photovoltaic device according claim 1, wherein said layer of metal-oxide nanoparticles is about 40 nanometers thick.

4. A metal-chalcogenide photovoltaic device according to claim 1, wherein said window layer is in direct contact with said photon-absorption layer and is free of a buffer layer comprising cadmium.

5. A metal-chalcogenide photovoltaic device according to claim 1, wherein at least some of said metal-oxide nanoparticles are doped metal-oxide nanoparticles.

6. A metal-chalcogenide photovoltaic device according to claim 1, wherein at least some of said metal-oxide nanoparticles are doped with a material comprising at least one of the elements Cs, Cu, Co, Ni, Cr, Mn, Mo, Nb, V, Fe, Ru, Au, Ag, Pt, C, N, B, S, I, F, P, Al, Ga, In, Sn, Sb, and Cl.

7. A metal-chalcogenide photovoltaic device according to claim 1, wherein said metal-chalcogenide semiconductor comprises at least one of $Cu(In,Ga)(Se,S)_2$, $Cu_2ZnSn(S,Se)_4$ or CdTe metal-chalcogenide semiconductors.

8. A method of producing a metal-chalcogenide photovoltaic device, comprising:
providing a photovoltaic substructure;
providing a solution of metal-oxide nanoparticles; and
forming a window layer on said substructure using said solution of metal-oxide nanoparticles such that said window layer comprises a layer of metal-oxide nanoparticles formed by a solution process,
wherein said photovoltaic substructure comprises a metal-chalcogenide semiconductor photon absorption layer,
wherein said providing said solution of metal-oxide nanoparticles provides a solution of metal-oxide nanoparticles that are smaller than about 6.5 nanometers and larger than about 5.0 nanometers,
wherein said layer of metal-oxide nanoparticles formed by said solution process is less than 85 nanometers thick and greater than 15 nanometers thick, and wherein said metal-oxide nanoparticles are titanium dioxide nanoparticles.

9. A method of producing a metal-chalcogenide photovoltaic device according to claim 8, wherein said solution process used to form said layer of metal-oxide nanoparticles is at least one of a spin coating, slit coating, spray coating, dip coating, doctor blade, or printing process.

10. A method of producing a metal-chalcogenide photovoltaic device according to claim 9, wherein said solution process used to form said layer of metal-oxide nanoparticles further includes a temperature annealing process in which heat is applied at a temperature less than about 400° C.

11. A method of producing a metal-chalcogenide photovoltaic device according to claim 8, wherein said providing a solution of metal-oxide nanoparticles further includes producing metal-oxide nanoparticles by at least one of a sol-gel, hydrothermal, solvothermal, thermolysis, or microemulsion process.

12. A method of producing a metal-chalcogenide photovoltaic device according to claim 8, wherein said providing said solution of metal-oxide nanoparticles provides a solution of metal-oxide nanoparticles that are about 6.3 nanometers.

13. A method of producing a metal-chalcogenide photovoltaic device according to claim 8, wherein said layer of metal-oxide nanoparticles formed by said solution process is about 40 nanometers thick.

14. A method of producing a metal-chalcogenide photovoltaic device according to claim 8, wherein said forming said window layer forms said window layer in direct contact with said metal-chalcogenide semiconductor photon-absorption layer and is free of a buffer layer comprising cadmium.

* * * * *